(12) United States Patent
Chang et al.

(10) Patent No.: US 10,629,636 B1
(45) Date of Patent: Apr. 21, 2020

(54) ARRAY SUBSTRATE

(71) Applicant: Au Optronics Corporation, Hsinchu (TW)

(72) Inventors: Chi-Ho Chang, New Taipei (TW); Sheng-Chin Fan, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/254,607

(22) Filed: Jan. 23, 2019

(30) Foreign Application Priority Data

Oct. 12, 2018 (TW) .............................. 107136106 A

(51) Int. Cl.
| | |
|---|---|
| *H01L 27/12* | (2006.01) |
| *H01L 29/786* | (2006.01) |
| *G06F 3/044* | (2006.01) |
| *G02F 1/1362* | (2006.01) |

(52) U.S. Cl.
CPC ........ *H01L 27/1255* (2013.01); *H01L 27/124* (2013.01); *H01L 27/1222* (2013.01); *H01L 27/1248* (2013.01); *H01L 29/78663* (2013.01); *G02F 1/1362* (2013.01); *G02F 2001/136222* (2013.01); *G06F 3/044* (2013.01)

(58) Field of Classification Search
CPC ... H01L 27/12; H01L 27/124; H01L 27/1222; H01L 27/1255; H01L 27/1248; H01L 27/3262; H01L 27/3248; H01L 27/3272; H01L 27/3251; H01L 27/3258; H01L 29/423; H01L 29/513; H01L 29/517; H01L 29/4908; H01L 29/4925; H01L 29/4966; H01L 29/4236; H01L 29/42376
USPC .......................................................... 257/49
See application file for complete search history.

(56) References Cited

U.S. PATENT DOCUMENTS

| | | | | |
|---|---|---|---|---|
| 2010/0182273 | A1* | 7/2010 | Noguchi | ............. G02F 1/13338 345/174 |
| 2014/0028616 | A1* | 1/2014 | Furutani | ........... G02F 1/134309 345/174 |

(Continued)

*Primary Examiner* — Chuong A Luu
(74) *Attorney, Agent, or Firm* — JCIPRNET

(57) ABSTRACT

An array substrate including a substrate, pixel structures, color filter patterns, a first common electrode layer, a second common electrode layer, a conductive structure, and a conductive pattern is provided. The substrate has a display area and a peripheral area. Each pixel structure is disposed in the display area and includes an active device and a pixel electrode. The color filter patterns are respectively disposed corresponding to the pixel structures. The first common electrode layer and the second common electrode layer are sequentially disposed on the color filter patterns, and are structurally separated from the pixel electrodes. The conductive structure is disposed in the peripheral area, and includes a first conductive layer, a second conductive layer and a third conductive layer sequentially disposed on the substrate, wherein the first conductive layer and the first common electrode layer belong to a first same layer, the second conductive layer and the pixel electrodes belong to a second same layer, the third conductive layer and the second common electrode layer belong to a third same layer. The conductive pattern is disposed in the peripheral area, and is electrically connected to the conductive structure.

10 Claims, 16 Drawing Sheets

(56) References Cited

U.S. PATENT DOCUMENTS

2014/0118639 A1* 5/2014 Matsushima ....... G02F 1/13338
349/12
2015/0177880 A1* 6/2015 Shin ..................... G06F 3/0412
345/174

* cited by examiner

ARRAY SUBSTRATE

CROSS-REFERENCE TO RELATED APPLICATION

This application claims the priority benefit of Taiwan application serial no. 107136106, filed on Oct. 12, 2018. The entirety of the above-mentioned patent application is hereby incorporated by reference herein and made a part of this specification.

BACKGROUND

Technical Field

The present invention relates to an array substrate, and more particularly to an active device array substrate.

Description of Related Art

With the development of liquid crystal display panels, high resolution has become one of the basic needs. In particular, in order to obtain high resolution, more pixels must be laid out under the same area, so the pixel size is getting smaller and smaller. However, as the pixel size becomes smaller and smaller, the ratio of storage capacitance to parasitic capacitance in each pixel is getting smaller and smaller, which causes the pixels to be easily affected by the feed through effect. Thereby, the screen shows a problem of poor brightness uniformity.

SUMMARY

At least one embodiment of the present invention provides an array substrate that increases the storage capacitance value of a pixel structure.

An array substrate according to at least one embodiment of the present invention includes a substrate, a plurality of pixel structures, a plurality of color filter patterns, a first common electrode layer, a second common electrode layer, a conductive structure, and a conductive pattern. The substrate has a display area and a peripheral area, wherein the peripheral area is located on at least one side of the display area. The pixel structures are located in the display area of the substrate, wherein each of the pixel structures includes an active device and a pixel electrode. The color filter patterns are located in the display area of the substrate and are respectively disposed corresponding to the pixel structures. The first common electrode layer is disposed on the color filter patterns and is structurally separated from the pixel electrodes. The second common electrode layer is disposed on the first common electrode layer and is structurally separated from the pixel electrodes. The conductive structure is located in the peripheral area of the substrate, wherein the conductive structure comprises a first conductive layer, a second conductive layer and a third conductive layer sequentially disposed on the substrate, wherein the first conductive layer and the first common electrode layer belong to a first patterned layer, the second conductive layer and the pixel electrodes belong to a second patterned layer, and the third conductive layer and the second common electrode layer belong to a third patterned layer. The conductive pattern is located in the peripheral area of the substrate, wherein the conductive structure is electrically connected to the conductive pattern.

Based on the above, in the array substrate according to at least one embodiment of the present invention, the pixel structures are located in the display area, each of the pixel structures includes the active device and the pixel electrode, the color filter patterns respectively correspond to the pixel structures, the first common electrode layer is disposed on the color filter patterns and structurally separated from the pixel electrodes, the second common electrode layer is disposed on the first common electrode layer and structurally separated from the pixel electrodes, the conductive structure is located in the peripheral area and includes the first conductive layer belonging to the first patterned layer as the first common electrode layer, the second conductive layer belonging to the second patterned layer as the pixel electrodes, and the third layer belonging to the third patterned layer as the second common electrode layer, such that the storage capacitor value of the pixel structures is effectively increased when the array substrate is driven. In this way, when the array substrate is applied to a high-resolution display panel, influence of the feedthrough effect on the pixel structures may be reduced.

The above described features and advantages of the invention will be apparent from the following description.

DESCRIPTION OF THE EMBODIMENTS

Figure 1:
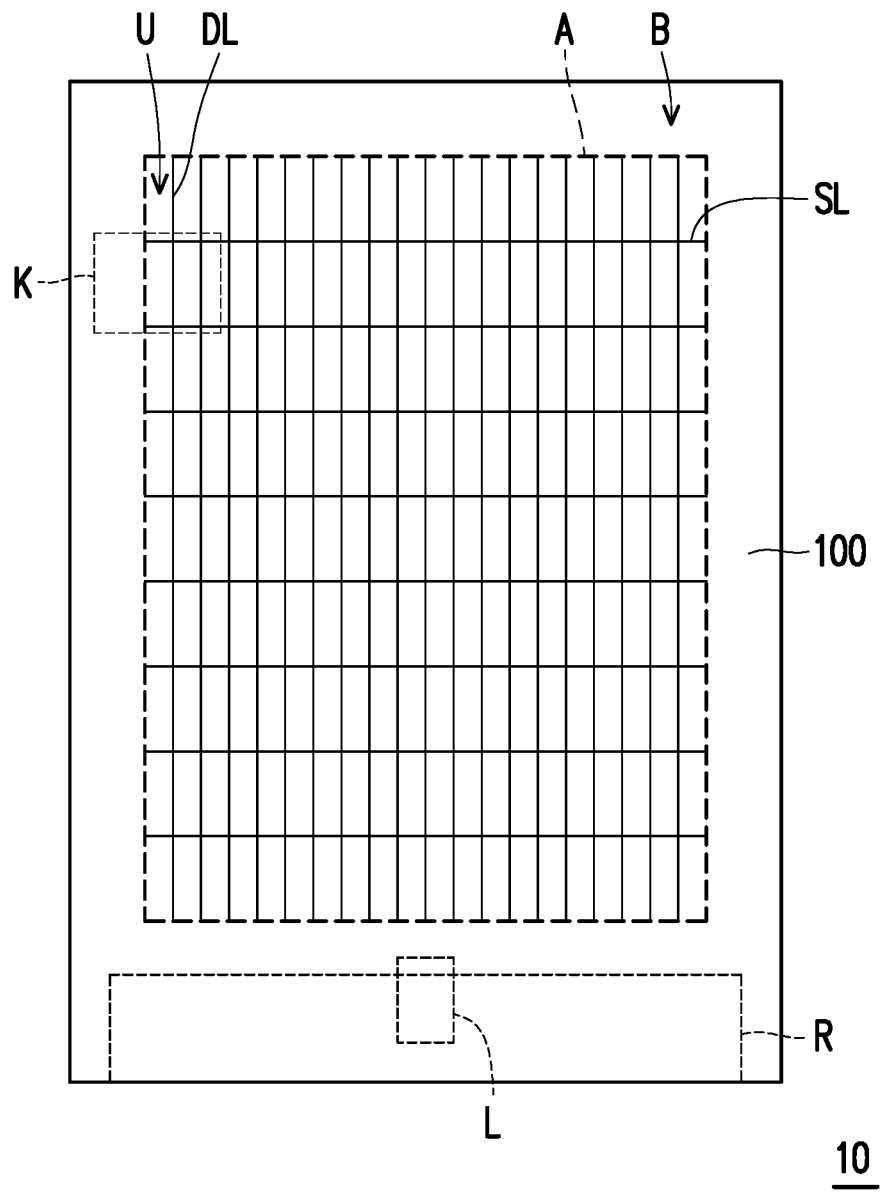
FIG. 1 is a top plan view of an array substrate in accordance with an embodiment of the present invention.

In the present specification, a range represented by "a numerical value to another numerical value" is a schematic representation for avoiding listing all of the numerical values in the range in the specification. Therefore, the recitation of a specific numerical range covers any numerical value in the numerical range and a smaller numerical range defined by any numerical value in the numerical range, as is the case with the any numerical value and the smaller numerical range stated explicitly in the specification.

The term "about," "approximately," "essentially" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about," "approximately," "essentially" or "substantially" as used herein based on measuring properties, cutting properties or other properties, instead of applying one standard deviation across all the properties.

It should be understood that when an element such as a layer, film, region or substrate is referred to as being "on," "connected to" or "in contact with" another element, it can be directly on, connected to or in contact with the other element, or intervening elements may also be present. In contrast, when an element is referred to as being "directly on," "directly connected to" or "directly in contact with" another element, there are no intervening elements present. As used herein, the term "connected" may refer to physically connected and/or electrically connected (coupled). Therefore, intervening elements may be present in an electrical connection (coupling) between two elements.

It should be understood that, although the terms "first", "second", "third", etc., may be used herein to describe various elements, components, regions, layers and/or sections, these elements, components, regions, layers, and/or sections should not be limited by these terms. These terms are used to distinguish one element, component, region, layer or section from another element, component, region, layer or section. Thus, a first element, component, region, layer or section discussed below could be termed a second element, component, region, layer or section without departing from the teachings of exemplary embodiments.

Moreover, relative terms such as "below" and "above/on" may serve to describe the relation between one component and another component in the text according to the illustration of the drawings. It should also be understood that the relative terms are intended to include different orientations of an apparatus in addition to the orientation shown in the drawings. For example, if an apparatus in the drawings is flipped, a component described as being disposed "below" other components shall be re-orientated to be "above" other components. Thus, the exemplary term "below" may cover the orientations of "below" and "above", depending on a specific orientation of the drawings.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

FIG. 1 is a top plan view of an array substrate in accordance with an embodiment of the present invention.

Figure 2:
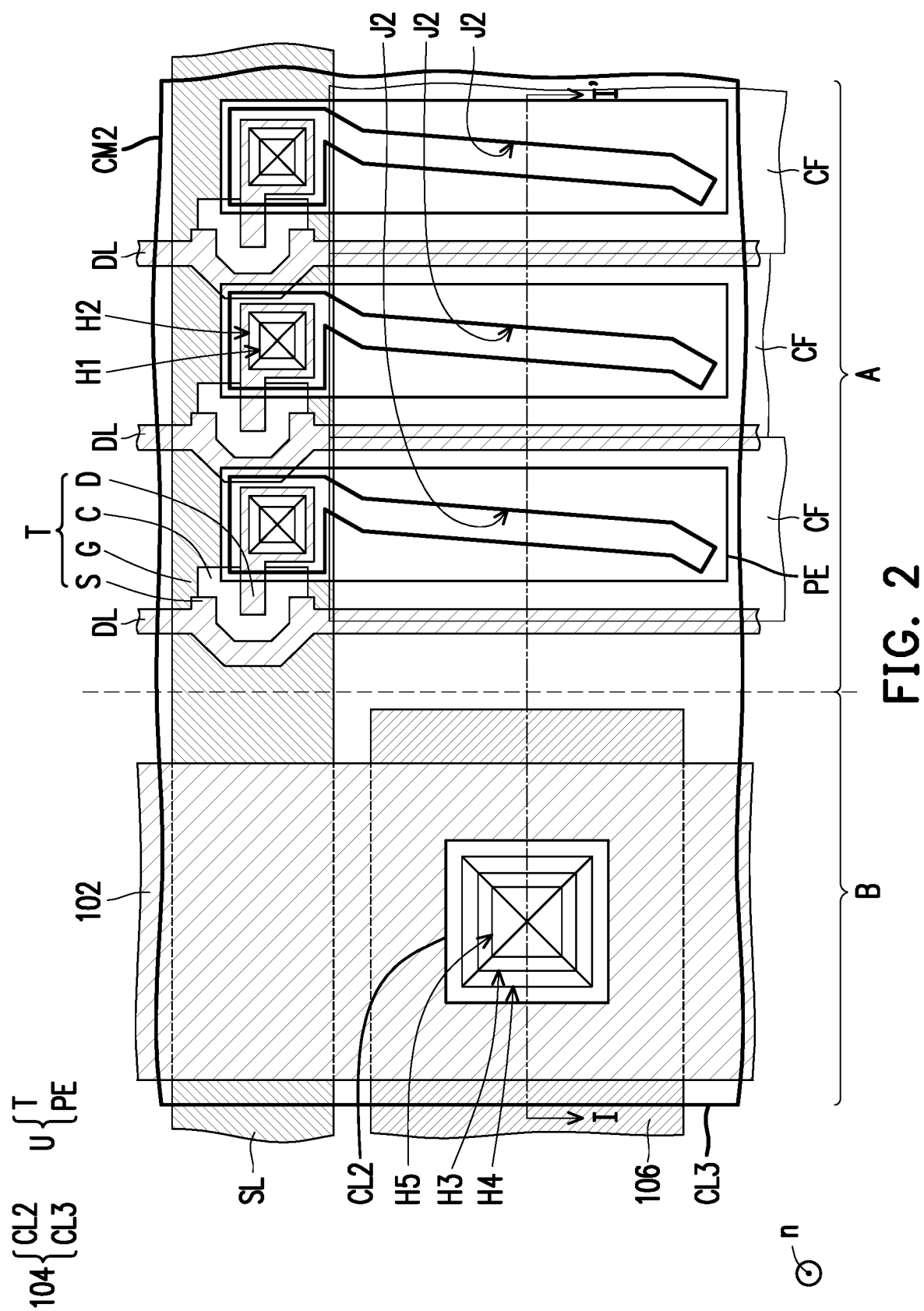
FIG. 2 is an enlarged schematic view of a region K in FIG. 1.
Figure 3:
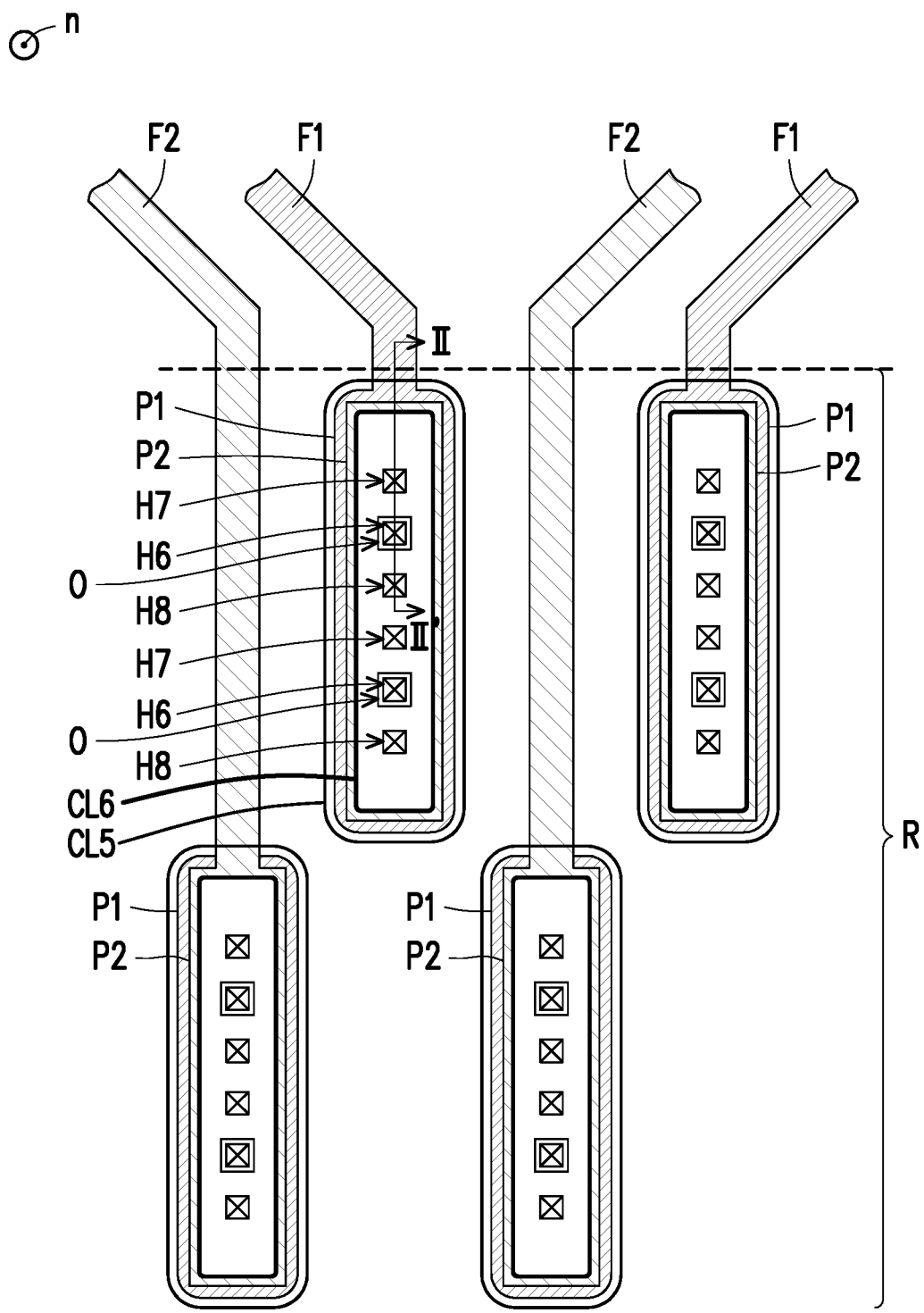
FIG. 3 is an enlarged schematic view of a region L in FIG. 1.
Figure 4:
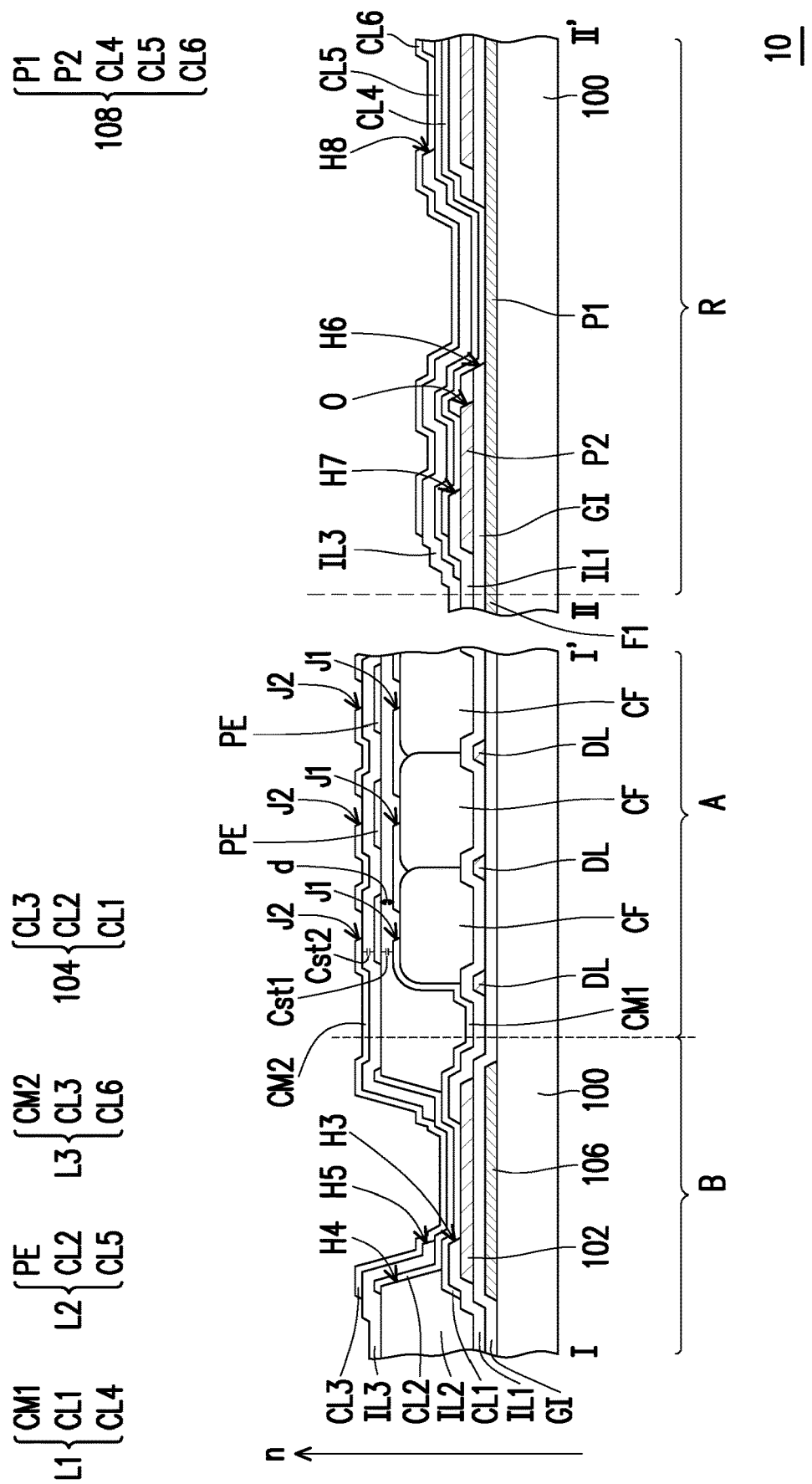
FIG. 4 is a cross-sectional view taken along a section line I-I' of FIG. 2 and a section line II-II' of FIG. 3.

FIG. 2 is an enlarged schematic view of a region K in FIG. 1. FIG. 3 is an enlarged schematic view of a region L in FIG. 1. FIG. 4 is a cross-sectional view taken along a section line I-I' of FIG. 2 and a section line II-IF of FIG. 3.

Referring to FIG. 1 to FIG. 4, an array substrate 10 may include a substrate 100, a plurality of pixel structures U, a plurality of color filter patterns CF, a first common electrode layer CM1, a second common electrode layer CM2, a conductive pattern 102, and a conductive structure 104. In this embodiment, the array substrate 10 may optionally further include a plurality of scan lines SL, a plurality of data lines DL, a conductive pattern 106, a plurality of fan-out lines F1, a plurality of fan-out lines F2, and a plurality of pad structures 108, a gate insulating layer GI, an insulating layer ILL an insulating layer IL2, and an insulating layer IL3. For convenience of description, part of the layers are omitted in FIG. 2 and FIG. 3 to clearly show the arrangement relationship between the layers.

In the present embodiment, the substrate 100 has a display area A and a peripheral area B, wherein the peripheral area B surrounds the display area A. However, the invention is not limited thereto. In other embodiments, the peripheral area B is located on at least one side of the display area A. Further, in the present embodiment, the outer lead bonding region R is provided in the peripheral area B. In the present embodiment, the material of the substrate 100 may be glass, quartz or an organic polymer.

In the present embodiment, the scan lines SL and the data lines DL are disposed on the substrate 100. In the present embodiment, the scan lines SL are not parallel to the data lines DL, that is, the scan lines SL and the data lines DL are disposed to cross each other. In addition, the scan lines SL and the data lines DL may be formed from different layers, and the gate insulating layer GI (described in detail later) may be sandwiched between the scan lines SL and the data lines DL. Based on the conductivity considerations, the scan lines SL and the data lines DL are generally made of a metal material. However, the present invention is not limited thereto, and according to other embodiments, the scan lines SL and the data lines DL may be made of, for example, other conductive materials such as an alloy, a nitride of a metal material, an oxide of a metal material, an oxynitride of a metal material, or a stacked layer of said metal material and said other conductive materials described above. In addition, in the present embodiment, the scan lines SL may have a single-layer structure or a multilayer structure, and the data lines DL may have a single-layer structure or a multilayer structure.

In the present embodiment, the pixel structures U are located in the display area A of the substrate 100. In the embodiment, each pixel structure U is electrically connected to one of the scan lines SL and one of the data lines DL. In this embodiment, each pixel structure U may include an active device T and a pixel electrode PE electrically connected to the active device T, as shown in FIG. 2.

In the present embodiment, the active device T includes a gate G, a channel layer C corresponding to the gate G, a drain D and a source S electrically connected to the channel layer C. In the present embodiment, a portion of the scan line SL itself is used as the gate G, which means that the gate G and the scan line SL are electrically connected to each other. However, the invention is not limited thereto. In other embodiments, the gate G can be implemented by a portion extending from the scan line SL. In this embodiment, the source S and the data line DL form a continuous conductive pattern, which means that the source S and the data line DL are electrically connected to each other. From another point of view, in the present embodiment, the source S and the data line DL belong to a same patterned layer. That is to say, in the present embodiment, the source S and the data line DL have substantially the same material, and the source S and the data line DL may be formed in the same mask process. Further, in the present embodiment, the drain D and the source S belong to a same patterned layer. That is to say, in the present embodiment, the source S, the drain D and the data line DL have substantially the same material, and the source S, the drain D and the data line DL may be formed in a same mask process. Further, in the present embodiment, the source S and the drain D are disposed directly on the channel layer C.

In the present embodiment, the channel layer C is located above the gate G. This indicates that in the present embodiment, the active device T is exemplified by a bottom gate type thin film transistor, but the present invention is not limited thereto. In other embodiments, the active device T can also be a top gate type thin film transistor, a stereotype thin film transistor, or other suitable type of thin film transistor. In addition, in the embodiment, the material of the channel layer C may be amorphous silicon, that is, the active device T may be an amorphous silicon TFT (a-Si TFT). However, the invention is not limited thereto. In other embodiments, the material of the channel layer C may include microcrystalline silicon, nanocrystalline silicon, polycrystalline silicon, single crystal silicon, organic semiconductor material, oxide semiconductor material, carbon nanotube/rod, perovskite or other suitable materials.

In the present embodiment, the pixel electrode PE is electrically connected to the drain D of the active device T through the contact window H1 and the contact window H2 connected with each other. In the present embodiment, the contact window H1 is provided in the insulating layer IL1 (described later in detail), and the contact window H2 is provided in the insulating layer IL2 (described later in detail). In this embodiment, the material of the pixel electrode PE may include a metal oxide conductive material, such as indium tin oxide, indium zinc oxide, aluminum tin oxide, aluminum zinc oxide, indium gallium zinc oxide, other suitable oxides, or a stacked layer of at least two of the foregoing.

In the present embodiment, the gate insulating layer GI covers the gate G of the active device T and is located between the gate G and the channel layer C. In the present embodiment, the material of the gate insulating layer GI may be an inorganic material, an organic material, or a combination thereof. The inorganic material is, for example, silicon oxide, silicon nitride, silicon oxynitride, or a stacked layer of at least two of the above materials. The organic material is, for example, a polymer material such as a polyimide resin, an epoxy resin, or an acrylic resin. In addition, the gate insulating layer GI may be a single-layer structure or a multilayer structure. For convenience of explanation, the gate insulating layer GI is omitted in FIG. 2 and FIG. 3.

In the present embodiment, the insulating layer IL1 covers the active device T, the scan line SL, and the data line DL to provide insulation and protection functions. In the present embodiment, the material of the insulating layer IL1 may be an inorganic material, an organic material, or a combination thereof. The inorganic material is, for example, silicon oxide, silicon nitride, silicon oxynitride, or a stacked layer of at least two of the above materials. The organic material is, for example, a polymer material such as a polyimide resin, an epoxy resin, or an acrylic resin. In addition, the insulating layer IL1 may have a single-layer structure or a multilayer structure. For convenience of explanation, the insulating layer IL1 is omitted in FIG. 2 and FIG. 3.

In the present embodiment, the color filter patterns CF are located in the display area A of the substrate 100, and the color filter patterns CF are respectively disposed corresponding to the pixel structures U. In the present embodiment, the color filter patterns CF are disposed between the insulating layer IL1 and the insulating layer IL2. In the embodiment, the color filter patterns CF may be a red filter pattern, a green filter pattern, or a blue filter pattern. However, the present invention does not limit the color combination of the color filter patterns CF, depending on the needs of the designer. In addition, although the color filter patterns CF are located on the substrate 100 to form a color filter on array (COA) structure, the invention is not limited thereto.

In the present embodiment, the first common electrode layer CM1 is disposed on the color filter patterns CF. In the present embodiment, the first common electrode layer CM1 is directly in contact with the color filter patterns CF. Further, in the present embodiment, the first common electrode layer CM1 and the pixel electrodes PE are structurally separated. That is, the first common electrode layer CM1 is not in contact with the pixel electrodes PE. In the present embodiment, the first common electrode layer CM1 has a plurality of first slits J1, and the first slits J1 are provided corresponding to the pixel electrodes PE respectively. As shown in FIG. 4, the first slit J1 overlaps the corresponding pixel electrode PE on a vertical projection plane perpendicular to the normal direction n of the substrate 100. However, the present invention does not limit thereto. The number of the first slits J1 of the first common electrode layer CM1 overlapping the corresponding single one pixel electrode PE may be plural. In this embodiment, the material of the first common electrode layer CM1 may include a metal oxide conductive material, such as indium tin oxide, indium zinc oxide, aluminum tin oxide, aluminum zinc oxide, indium gallium zinc oxide, other suitable oxides or a stacked layer of at least two of the above.

In the present embodiment, the insulating layer IL2 covers the first common electrode layer CM1 and is located between the first common electrode layer CM1 and the pixel electrodes PE to provide protection and ensure planarization. In the present embodiment, a storage capacitor Cst1 is formed between the first common electrode layer CM1 and the pixel electrodes PE, wherein the insulating layer IL2 located between the first common electrode layer CM1 and the pixel electrodes PE serves as a capacitor insulating layer of the storage capacitor Cst1. In addition, the distance d between the first common electrode layer CM1 and the pixel electrodes PE is between about 0.1 μm and about 1 μm in the normal direction n of the substrate 100. In the present embodiment, the material of the insulating layer IL2 may be an inorganic material, an organic material, or a combination thereof. The inorganic material is, for example, silicon oxide, silicon nitride, silicon oxynitride, or a stacked layer of at least two of the above materials. The organic material is, for example, a polymer material such as a polyimide resin, an epoxy resin, or an acrylic resin. In addition, the insulating layer IL2 may have a single-layer structure or a multilayer structure. For convenience of explanation, the insulating layer IL2 is omitted in FIG. 2 and FIG. 3.

In the present embodiment, the second common electrode layer CM2 is disposed on the first common electrode layer CM1, and the second common electrode layer CM2 is structurally separated from the pixel electrodes PE. That is, the second common electrode layer CM2 is not in contact with the pixel electrodes PE. In the present embodiment, the second common electrode layer CM2 has a plurality of second slits J2, and the second slits J2 are provided corresponding to the pixel electrodes PE. As shown in FIG. 4, the second slit J2 overlaps the corresponding pixel electrode PE on the vertical projection plane perpendicular to the normal direction n of the substrate 100. However, the present invention does not limit thereto. The number of the second slits J2 of the second common electrode layer CM2 overlapping the corresponding single one pixel electrode PE may be plural. It is worth mentioning that when the array substrate 10 is applied to the display panel, a fringe electric field that can be used to drive the display medium is generated between the edge of the second slit J2 and the corresponding pixel electrode PE. In the present embodiment, the array substrate 10 may be applied to a liquid crystal display panel of a fringe field switching (FFS) mode or a liquid crystal display panel of an Advanced Hyper-Viewing Angle (AHVA) mode. For example, the liquid crystal display panel includes the array substrate of each embodiment of the present invention, the opposite substrate, and the liquid crystal layer, and the liquid crystal layer is located between the array substrate of each embodiment of the present invention and the opposite substrate.

Further, in the present embodiment, the first common electrode layer CM1 and the second common electrode layer CM2 may have same contours on the vertical projection plane perpendicular to the normal direction n of the substrate 100. As a result, as shown in FIG. 4, the second slits J2 respectively overlap the first slits J1 on the vertical projection plane perpendicular to the normal direction n of the substrate 100. For convenience of explanation and observation, the first common electrode layer CM1 is omitted in FIG. 2. In this embodiment, the material of the second common electrode layer CM2 may include a metal oxide conductive material, such as indium tin oxide, indium zinc oxide, aluminum tin oxide, aluminum zinc oxide, indium gallium zinc oxide, other suitable oxides or a stacked layer of at least two of the above.

In the present embodiment, the insulating layer IL3 covers the pixel electrodes PE and is located between the pixel electrodes PE and the second common electrode layer CM2. In the present embodiment, a storage capacitor Cst2 is formed between the second common electrode layer CM2 and the pixel electrodes PE, wherein the insulating layer IL3 between the second common electrode layer CM2 and the pixel electrodes PE is used as a capacitor insulating layer of the storage capacitor Cst2. In the present embodiment, the material of the insulating layer IL3 may be an inorganic material, an organic material, or a combination thereof. The inorganic material is, for example, silicon oxide, silicon nitride, silicon oxynitride, or a stacked layer of at least two of the above materials. The organic material is, for example, a polymer material such as a polyimide resin, an epoxy resin, or an acrylic resin. In addition, the insulating layer IL3 may have a single-layer structure or a multilayer structure. For convenience of explanation, the insulating layer IL3 is omitted in FIGS. 2 and 3.

In the present embodiment, the conductive pattern 102 is located in the peripheral area B of the substrate 100. In the present embodiment, the conductive pattern 102 is located on the gate insulating layer GI and a portion of the conductive pattern 102 is exposed by the contact window H3, wherein the contact window H3 is disposed in the insulating layer IL1. This indicates that in the present embodiment, the gate insulating layer GI and the insulating layer IL1 are extended from the display area A to the peripheral area B, that is, both of the gate insulating layer GI and the insulating layer IL1 are disposed in both of the display area A and the peripheral area B. In addition, in the present embodiment, the conductive pattern 102 and the source S, the drain D, and the data line DL belong to a same patterned layer. That is, in the present embodiment, the conductive pattern 102, the source S, the drain D and the data line DL have substantially the same material, and the conductive pattern 102, the source S, the drain D, and the data line DL may be formed in a same mask process. In addition, the conductive pattern 102 is located on at least one side of the display area A. In one embodiment, the conductive pattern 102 may be exemplified around the display area A to form a closed ring structure. In another embodiment, the conductive pattern 102 may be exemplified around the display area A to form a non-closed ring structure.

In the present embodiment, the conductive structure 104 is located in the peripheral area B of the substrate 100. In this embodiment, the conductive structure 104 may include a first conductive layer CL1, a second conductive layer CL2, and a third conductive layer CL3 sequentially disposed on the substrate 100. Referring to FIG. 2 and FIG. 4, the first conductive layer CL1 is electrically connected to the conductive pattern 102 through the contact window H3, the second conductive layer CL2 is electrically connected to the first conductive layer CL1 through the contact window H4, and the third conductive layer CL3 is electrically connected to the second conductive layer CL2 through the contact window H5, wherein the contact window H4 is disposed in the insulating layer IL2, and the contact window H5 is disposed in the insulating layer IL3. This indicates that in the present embodiment, the conductive structure 104 is electrically connected to the conductive pattern 102, and all of the insulating layer IL2 and the insulating layer IL3 are extended from the display area A to the peripheral area B, that is, both the insulating layer IL2 and the insulating layer IL3 are disposed in both the display area A and the peripheral area B. It is worth mentioning that in the embodiment, the second conductive layer CL2 is disposed on the first conductive layer CL1 to provide a protection function, so that the first conductive layer CL1 is not affected by the subsequent process.

In the present embodiment, the first conductive layer CL1 and the first common electrode layer CM1 belong to a first patterned layer, the second conductive layer CL2 and the pixel electrodes PE belong to a second patterned layer, and the third conductive layer CL3 and the second common electrode layer CM2 belong to a third patterned layer. That is, in the present embodiment, the first conductive layer CL1 and the first common electrode layer CM1 have substantially the same material, the second conductive layer CL2 and the pixel electrodes PE have substantially the same material, the third conductive layer CL3 and the second common electrode layer CM2 have substantially the same material, and the first conductive layer CL1 and the first common electrode layer CM1 may be formed in a first mask process, the second conductive layer CL2 and the pixel electrodes PE may be formed in a second mask process, the third conductive layer CL3 and the second common electrode layer CM2 may be formed in a third mask process.

In the present embodiment, the first conductive layer CL1 is directly connected to the first common electrode layer CM1, and the third conductive layer CL3 is directly connected to the second common electrode layer CM2. That is, in the present embodiment, the first conductive layer CL1 and the first common electrode layer CM1 may receive signals at substantially the same level, and the third conductive layer CL3 and the second common electrode layer CM2 may receive signals at substantially the same level. Further, in the embodiment, the second conductive layer CL2 is structurally separated from the pixel electrodes PE. That is to say, in the present embodiment, the second conductive layer CL2 and the pixel electrode PE can receive signals at different levels. As described above, the conductive structure 104 is electrically connected to the conductive pattern 102, and thus the conductive pattern 102, the first conductive layer CL1, the first common electrode layer CM1, the second conductive layer CL2, the third conductive layer CL3, and the second common electrode Layer CM2 may receive signals at substantially the same level. For example, the conductive pattern 102, the first conductive layer CL1, the first common electrode layer CM1, the second conductive layer CL2, the third conductive layer CL3, and the second common electrode layer CM2 may be electrically connected to a common voltage which is, for example, about 0 volt.

In the present embodiment, the first conductive layer CL1 and the third conductive layer CL3 have same contours on the vertical projection plane perpendicular to the normal direction n of the substrate 100. For convenience of explanation and observation, the first conductive layer CL1 is omitted in FIG. 2.

In the present embodiment, the conductive pattern 106 is located in the peripheral area B of the substrate 100. In the present embodiment, the gate insulating layer GI is located between the conductive pattern 106 and the conductive pattern 102, and the conductive pattern 106 overlaps the conductive pattern 102 on the vertical projection plane perpendicular to the normal direction n of the substrate 100. In the present embodiment, the conductive pattern 106, the gate G and the scan line SL belong to a same patterned layer. That is, in the present embodiment, the conductive pattern 106, the gate G, and the scan line SL have substantially the same material, and the conductive pattern 106, the gate G, and the scan line SL may be formed in a same mask process. In other embodiments, the array substrate 10 may optionally not include the conductive pattern 106.

In the present embodiment, the fan-out lines F1 and the fan-out lines F2 are located in the peripheral area B of the substrate 100. As shown in FIG. 3, the fan-out lines F1 and the fan-out lines F2 are extended from the peripheral area B other than the outer lead bonding region R into the outer lead bonding region R. In the present embodiment, the fan-out line F1, the gate G, the scan line SL, and the conductive pattern 106 belong to a same patterned layer. That is, in the present embodiment, the fan-out line F1, the gate G, the scan line SL, and the conductive pattern 106 have substantially the same material, and the fan-out line F1, the gate G, the scan line SL, and the conductive pattern 106 may be formed in a same mask process. Further, in the present embodiment, the fan-out line F2, the source S, the drain D, the data line DL, and the conductive pattern 102 belong to a same patterned layer. That is, in the present embodiment, the fan-out line F2, the conductive pattern 102, the source S, the drain D, and the data line DL have substantially the same material, and the fan-out line F2, the conductive pattern 102, the source S, the drain D and the data line DL may be formed in a same mask process.

In the present embodiment, the pad structures 108 are located within the outer lead bonding region R. In the present embodiment, the fan-out lines F1 are electrically connected to a part of the pad structures 108, and the fan-out lines F2 are electrically connected to the another part of the pad structures 108. In this embodiment, each of the pad structures 108 may include a pad pattern P1, a pad pattern P2, a fourth conductive layer CL4, a fifth conductive layer CL5, and a sixth conductive layer CL6 which are sequentially disposed on the substrate 100.

Referring to FIG. 3 and FIG. 4, the pad pattern P1, the gate G, the scan line SL, the conductive pattern 106, and the fan-out line F1 belong to a same patterned layer. That is, in the present embodiment, the pad pattern P1, the fan-out line F1, the gate G, the scan line SL, and the conductive pattern 106 have substantially the same material, and the pad pattern P1, the fan-out line F1, the gate G, the scan line SL and the conductive pattern 106 may be formed in a same mask process. Further, in the present embodiment, the fan-out lines F1 are directly connected to the pad patterns P1 in the corresponding pad structures 108.

In the present embodiment, the pad patterns P2 are disposed on the gate insulating layer GI and have a plurality of openings O exposing a portion of the gate insulating layer GI. Although FIG. 3 discloses that each pad pattern P2 includes two openings O, the present invention does not limit the number of openings O, and the number of openings O may be adjusted according to the actual architecture and requirements of the array substrate 10. In the present embodiment, the pad pattern P2, the fan-out line F2, the source S, the drain D, the data line DL, and the conductive pattern 102 belong to a same patterned layer. That is, in the present embodiment, the pad pattern P2, the fan-out line F2, the conductive pattern 102, the source S, the drain D, and the data line DL have substantially the same material, and the pad pattern P2, the fan-out line F2, the conductive pattern 102, the source S, the drain D and the data line DL may be formed in a same mask process. Further, in the present embodiment, the fan-out lines F2 are directly connected to the pad patterns P2 in the corresponding pad structures 108.

Referring to FIG. 3 and FIG. 4, the fourth conductive layer CL4 and the fifth conductive layer CL5 are electrically connected to the corresponding pad pattern P1 through a plurality of contact windows H6, and are electrically connected the corresponding pad pattern P2 through a plurality of contact windows H7. The contact windows H6 are disposed in the gate insulating layer GI and the insulating layer IL1, and the contact windows H7 are disposed in the insulating layer IL1. Although FIG. 3 discloses that the fourth conductive layer CL4 and the fifth conductive layer CL5 are electrically connected to the corresponding pad pattern P1 through two contact windows H6, and are electrically connected to the corresponding pad pattern P2 through two contact windows H7, the invention does not limit the number of the contact windows H6 and the contact windows H7, and the number of the contact windows H6 and the contact windows H7 may be adjusted according to actual architecture and requirements of the array substrate 10. Further, on the vertical projection plane perpendicular to the normal direction n of the substrate 100, the contact window H6 overlaps the opening O of the pad pattern P2, and the size of the opening O is larger than the size of the contact window H6, for example.

Referring again to FIG. 3 and FIG. 4, the sixth conductive layer CL6 is electrically connected to the fourth conductive layer CL4 and the fifth conductive layer CL5 through a plurality of contact windows H8, wherein the contact windows H8 are disposed in the insulating layer IL3. Although FIG. 3 discloses that the sixth conductive layer CL6 is electrically connected to the fourth conductive layer CL4 and the fifth conductive layer CL5 through two contact windows H8, the present invention does not limit the number of contact windows H8, and the number of contact windows H8 may be adjusted according to actual architecture and requirements of the array substrate 10.

In the present embodiment, the fourth conductive layer CL4 and the first common electrode layer CM1 belong to the first patterned layer, the fifth conductive layer CL5 and the pixel electrodes PE belong to the second patterned layer, and the sixth conductive layer CL6 and the second common electrode layer CM2 belong to the third patterned layer. That is, in the present embodiment, the fourth conductive layer CL4 and the first common electrode layer CM1 have substantially same material, the fifth conductive layer CL5 and the pixel electrodes PE have substantially same material, the sixth conductive layer CL6 and the second common electrode layer CM2 have substantially same material, and the fourth conductive layer CL4 and the first common electrode layer CM1 may be formed in the first mask process, the fifth conductive layer CL5 and the pixel electrodes PE may be formed in the second mask process, the sixth conductive layer CL6 and the second common electrode layer CM2 may be formed in the third mask process. In addition, as described above, the first conductive layer CL1 and the first common electrode layer CM1 belong to the first patterned layer, the second conductive layer CL2 and the pixel electrodes PE belong to the second patterned layer, and the third conductive layer CL3 and the second common electrode layer CM2 belong to the third patterned layer, and thus the first common electrode layer CM1, the first conductive layer CL1 and the fourth conductive layer CL4 together constitute a conductor layer L1, the pixel electrodes PE, the second conductive layer CL2 and the fifth conductive layer CL5 together constitute a conductor layer L2, and the second common electrode layer CM2, the third conductive layer CL3 and the sixth conductive layer CL6 together constitute a conductor layer L3.

In the present embodiment, the fourth conductive layer CL4 and the sixth conductive layer CL6 have same contours on the vertical projection plane perpendicular to the normal direction n of the substrate 100. For convenience of explanation and observation, the fourth conductive layer CL4 is omitted in FIG. 3. In addition, as described above, on the vertical projection plane perpendicular to the normal direction n of the substrate 100, the first conductive layer CL1 and the third conductive layer CL3 have same contours, and the first common electrode layer CM1 and the second common electrode layer CM2 have same contours, and thus the conductor layer L1 constituted by the first common electrode layer CM1, the first conductive layer CL1 and the fourth conductive layer CL4 and the conductor layer L3 constituted by the second common electrode layer CM2, the third conductive layer CL3 and the sixth conductive layer CL6 may be fabricated by using same mask to save the cost of the mask.

It should be noted that, in the array substrate 10 of the present embodiment, the pixel structures U are located in the display area A, each pixel structure U includes the pixel electrode PE, the color filter patterns CF are disposed corresponding to the pixel structures U, the first common electrode layer CM1 is disposed on the color filter patterns CF and is structurally separated from the pixel electrodes PE, the second common electrode layer CM2 is disposed on the first common electrode layer CM1 and is structurally separated from the pixel electrodes PE, the conductive structure 104 is located in the peripheral area B and includes the first conductive layer CL1 belonging to the first patterned layer as the first common electrode layer CM1, the second conductive layer CL2 belonging to the second patterned layer as the pixel electrodes PE, and the third conductive layer CL3 belonging to the third patterned layer as the second common electrode layer CM2, thereby the storage capacitance value of the pixel structures U may increase. This is because when the array substrate 10 is driven, a storage capacitor Cst1 is formed between the first common electrode layer CM1 and the pixel electrodes PE, and a storage capacitor Cst2 electrically connected in parallel with the storage capacitor Cst1 is formed between the second common electrode layer CM2 and the pixel electrodes PE. As a result, when the array substrate 10 is applied to a high-resolution display panel, influence of the feedthrough effect on the pixel structures may U be reduced.

In addition, in the array substrate 10, the conductive structure 104 is electrically connected to the conductive pattern 102, but the present invention is not limited thereto. Hereinafter, other embodiments will be described with reference to FIG. 5. It should be noted that the reference numerals and some descriptions in the previous embodiment are used in the following embodiments, in which identical or similar reference numerals indicate identical or similar elements, and repeated description of the same technical contents is omitted. The omitted part of the description can refer to the foregoing embodiments, which is not repeated in the following embodiments.

Figure 5:
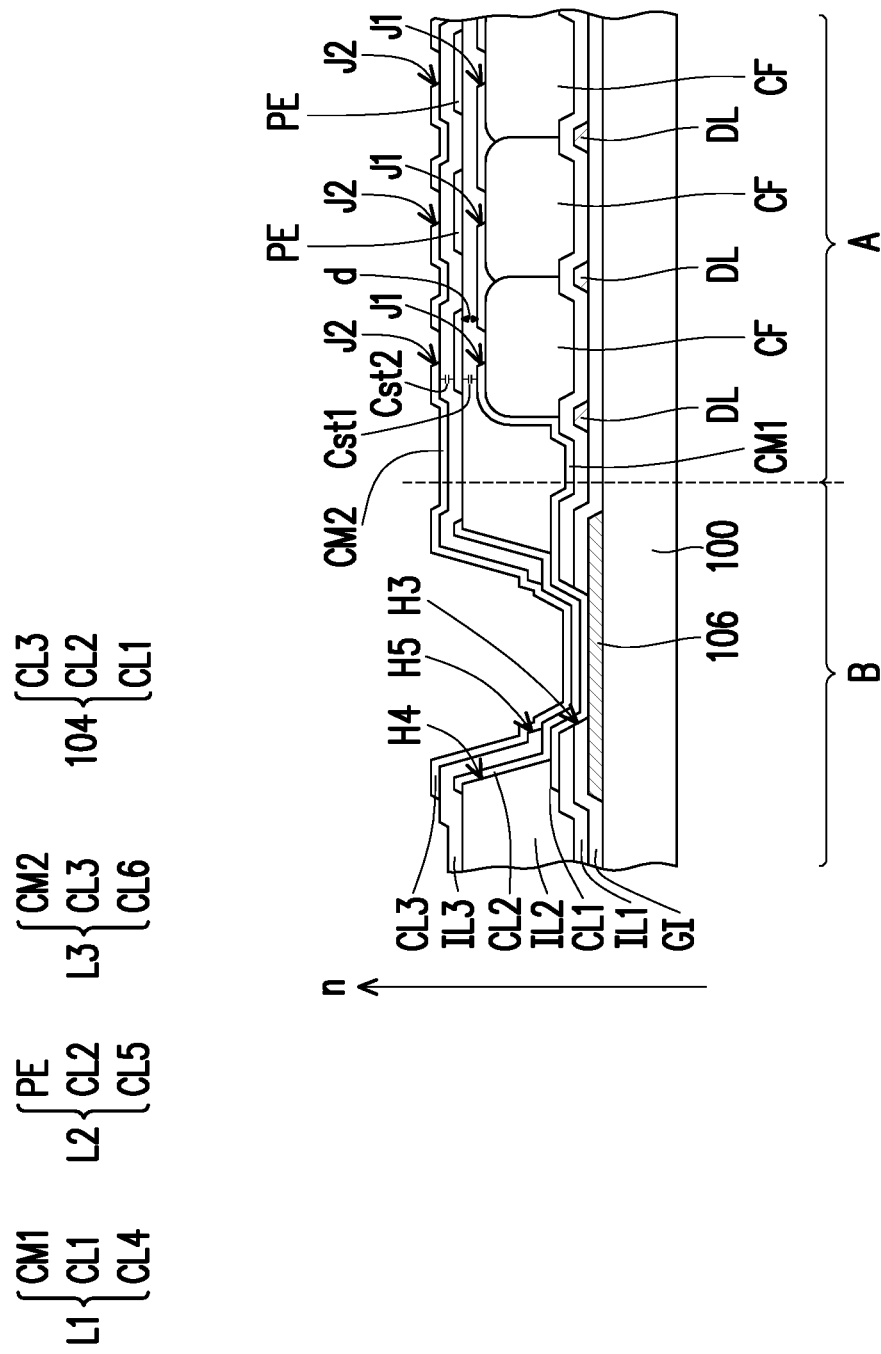
FIG. 5 is a partial cross-sectional view of an array substrate in accordance with another embodiment of the present invention.

FIG. 5 is a partial cross-sectional view of an array substrate in accordance with another embodiment of the present invention. Referring to FIG. 5 and FIG. 4, the array substrate 20 of FIG. 5 is similar to the array substrate 10 of FIG. 4, and therefore identical or similar elements are denoted by identical or similar reference numerals, and the description of the same technical contents is omitted. The omitted part of the description can refer to the foregoing embodiments. Hereinafter, the difference between the array substrate 20 of FIG. 5 and the array substrate 10 of FIG. 4 will be described.

Referring to FIG. 5, in the array substrate 20, the conductive structure 104 is electrically connected to the conductive pattern 106. In detail, in the array substrate 20, the first conductive layer CL1 is electrically connected to the conductive pattern 106 by the contact window H3 provided in the gate insulating layer GI and the insulating layer ILL For the rest, please refer to the foregoing embodiments, and details are not described herein.

Further, in the array substrate 10, the gate insulating layer GI is disposed between the conductive pattern 106 and the conductive pattern 102, but the present invention is not limited thereto. Hereinafter, other embodiments will be described with reference to FIG. 6. It should be noted that the reference numerals and some descriptions in the previous embodiment are used in the following embodiments, in which identical or similar reference numerals indicate identical or similar elements, and repeated description of the same technical contents is omitted. The omitted part of the description can refer to the foregoing embodiment, which is not repeated in the following embodiments.

Figure 6:
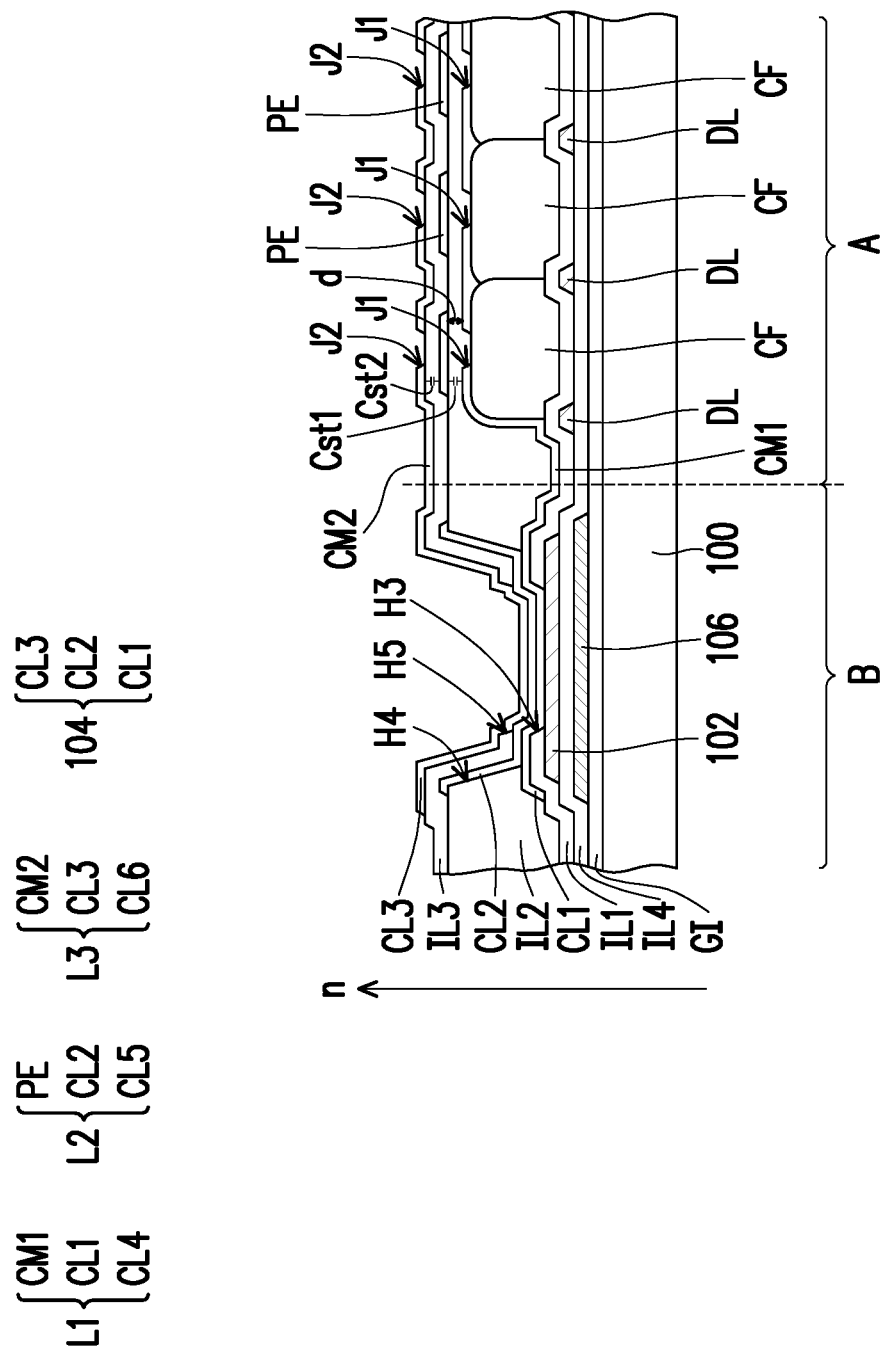
FIG. 6 is a partial cross-sectional view of an array substrate in accordance with another embodiment of the present invention.

FIG. 6 is a partial cross-sectional view of an array substrate in accordance with another embodiment of the present invention. Referring to FIG. 6 and FIG. 4, the array substrate 30 of FIG. 6 is similar to the array substrate 10 of FIG. 4, and therefore identical or similar elements are denoted by identical or similar reference numerals, and the description of the same technical contents is omitted. The omitted part of the description can refer to the foregoing embodiments. Hereinafter, the difference between the array substrate 30 of FIG. 6 and the array substrate 10 of FIG. 4 will be described.

Referring to FIG. 6, in the array substrate 30, the conductive pattern 106 is disposed on the gate insulating layer GI. In addition, in the array substrate 30, an insulating layer IL4 is disposed on the conductive pattern 106, the conductive pattern 102 is disposed on the insulating layer IL4, and the insulating layer IL4 is disposed between the conductive pattern 106 and the conductive pattern 102. In the present embodiment, the material of the insulating layer IL4 may be an inorganic material, an organic material, or a combination thereof. The inorganic material is, for example, silicon oxide, silicon nitride, silicon oxynitride, or a stacked layer of at least two of the above materials. The organic material is, for example, a polymer material such as a polyimide resin, an epoxy resin, or an acrylic resin. In addition, the insulating layer IL4 may have a single-layer structure or a multilayer structure. For the rest, please refer to the foregoing embodiments, and details are not described herein.

Further, in the array substrate 10, the second common electrode layer CM2 serves as a display electrode, but the present invention is not limited thereto. In other embodiments, the second common electrode layer CM2 can serve as a touch electrode in addition to the display electrode. Hereinafter, other embodiments will be described with reference to FIGS. 7 to 11. It should be noted that the reference numerals and some descriptions in the previous embodiment are used in the following embodiments, in which identical or similar reference numerals indicate identical or similar elements, and repeated description of the same technical contents is omitted. The omitted part of the description can refer to the foregoing embodiments, which is not repeated in the following embodiments.

Figure 7:
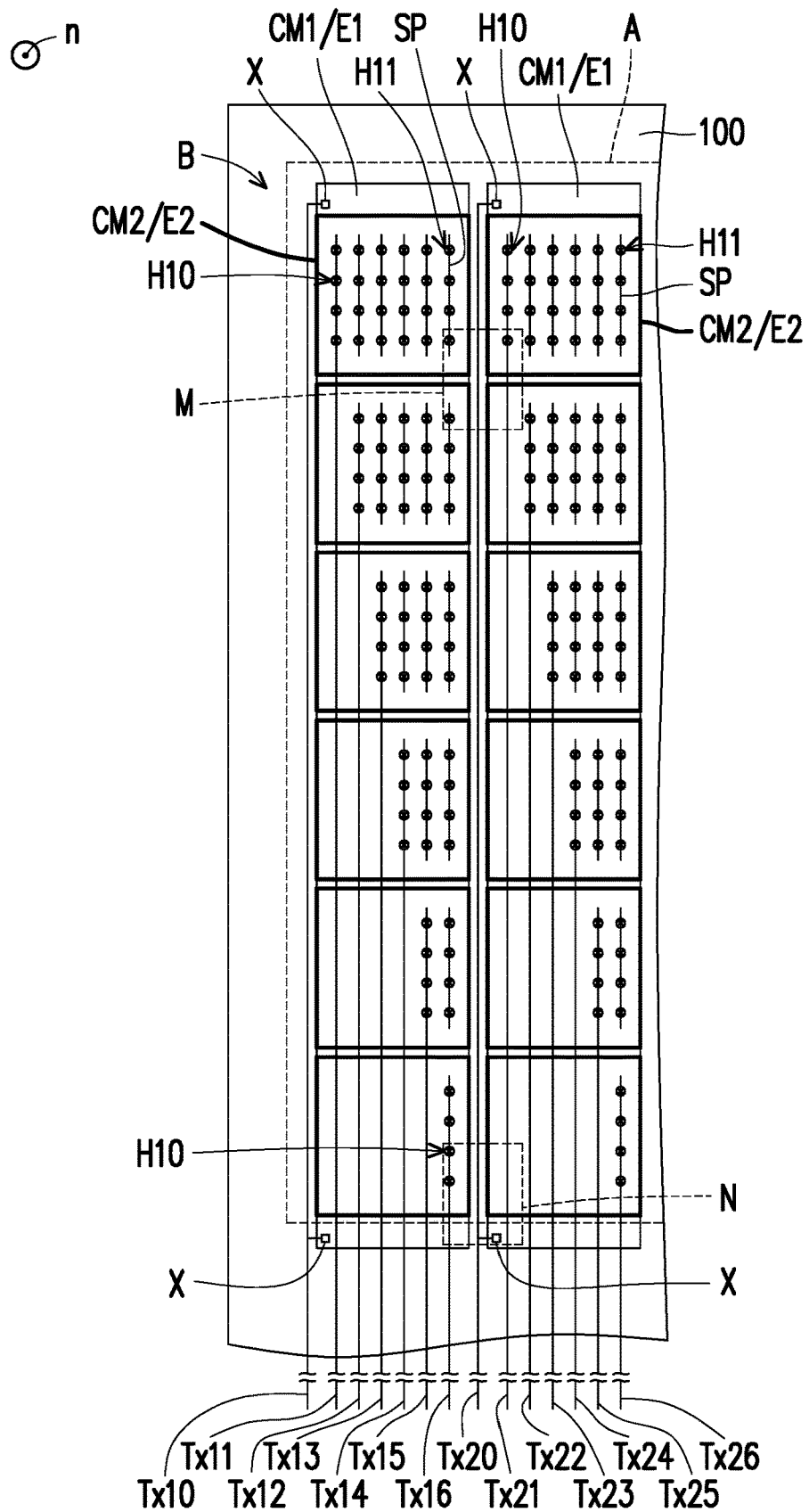
FIG. 7 is a partial top plan view of an array substrate in accordance with another embodiment of the present invention.
Figure 8:
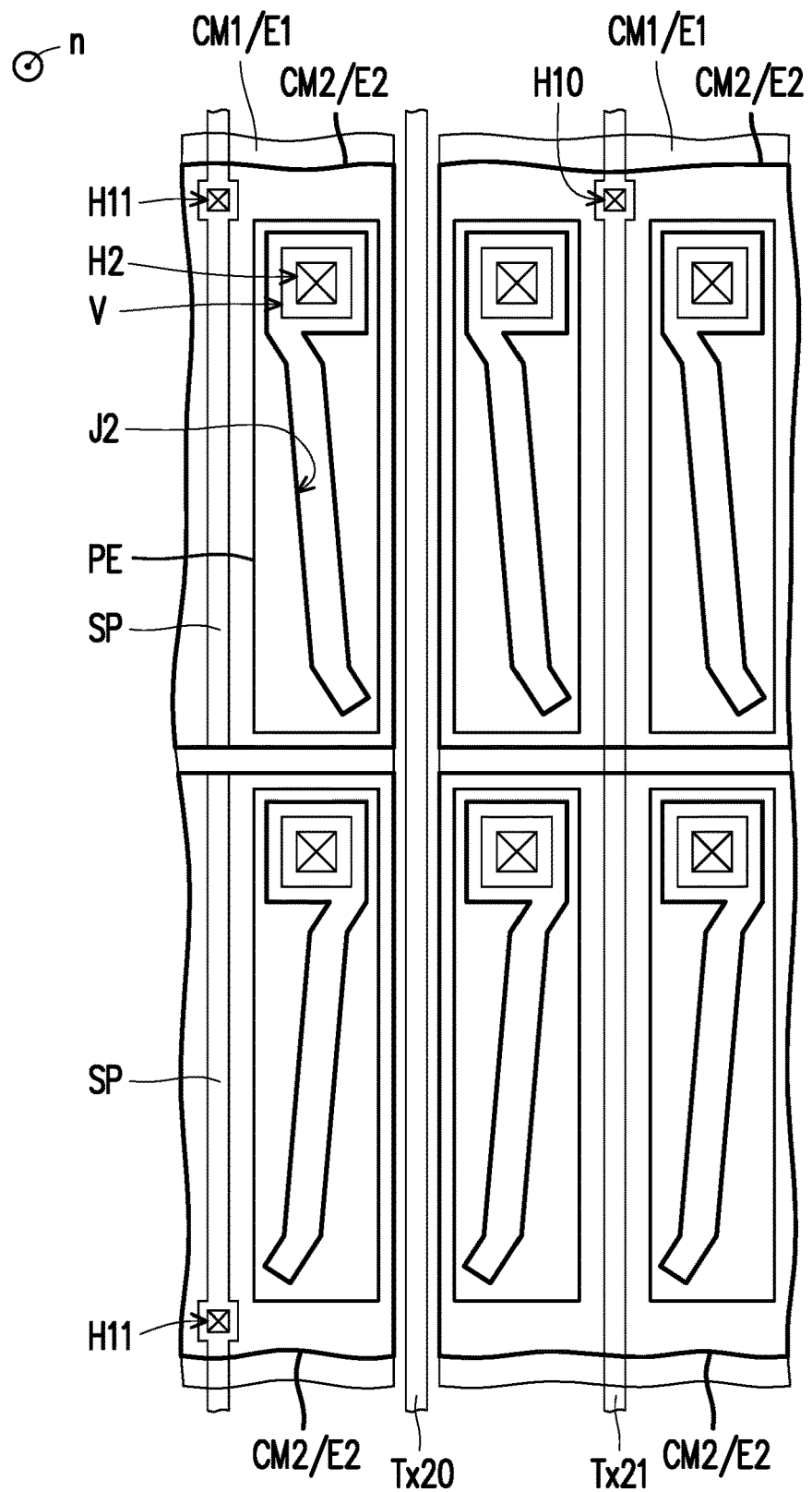
FIG. 8 is an enlarged schematic view of a region M in FIG. 7.
Figure 9:
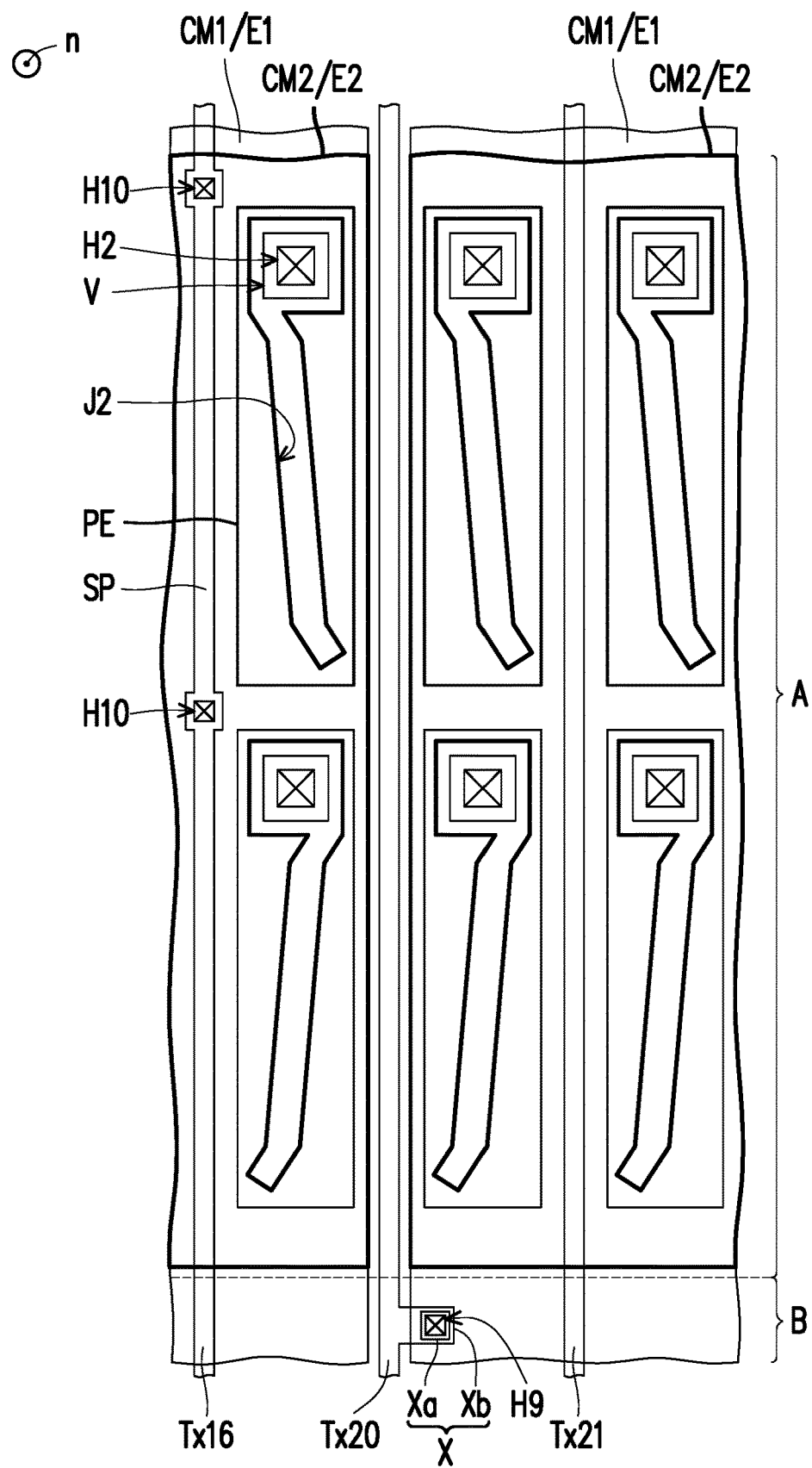
FIG. 9 is an enlarged schematic view of a region N in FIG. 7.
Figure 10:
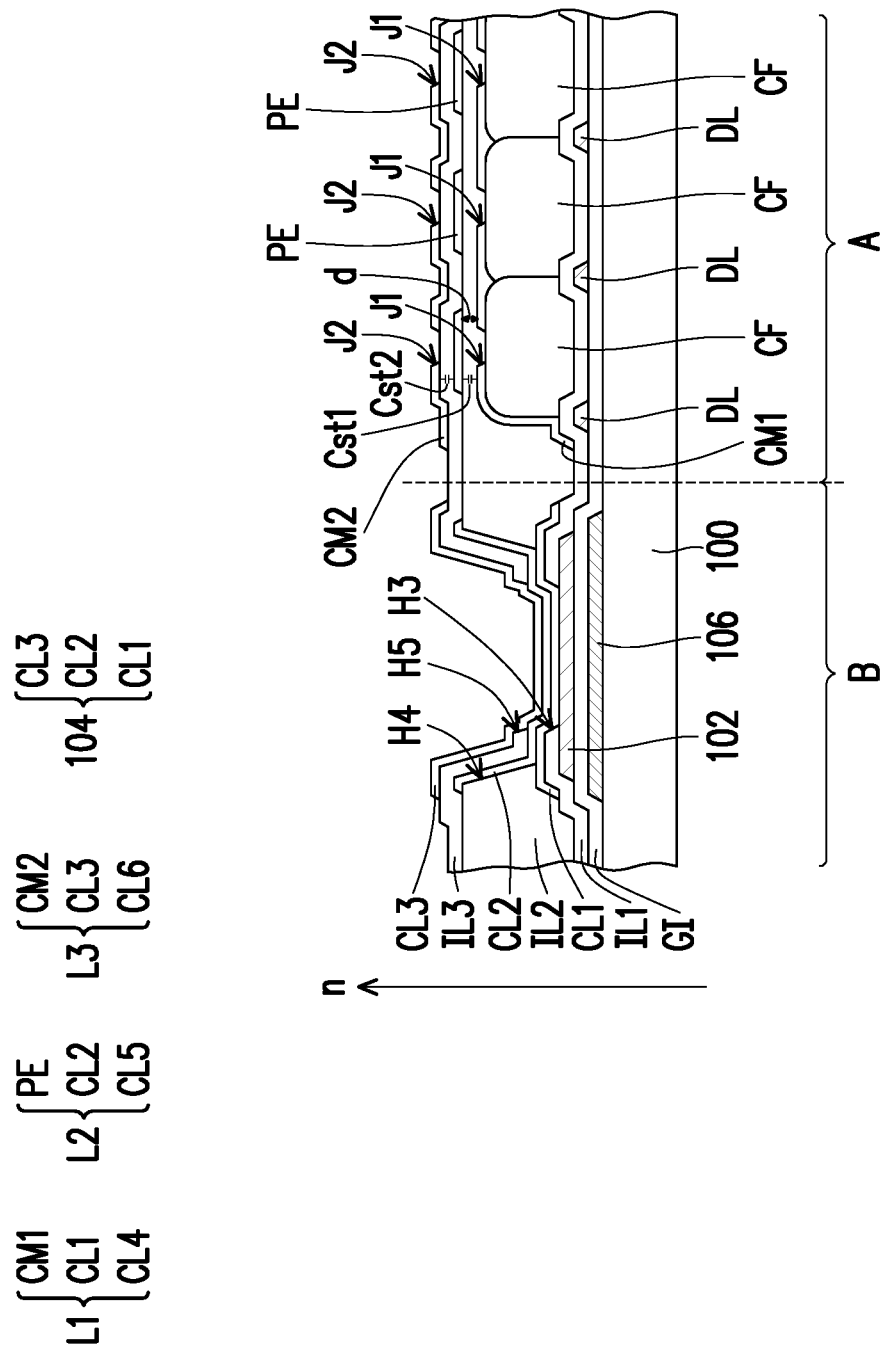
FIG. 10 is a schematic cross-sectional view showing a partial region of the array substrate of FIG. 7.
Figure 11:
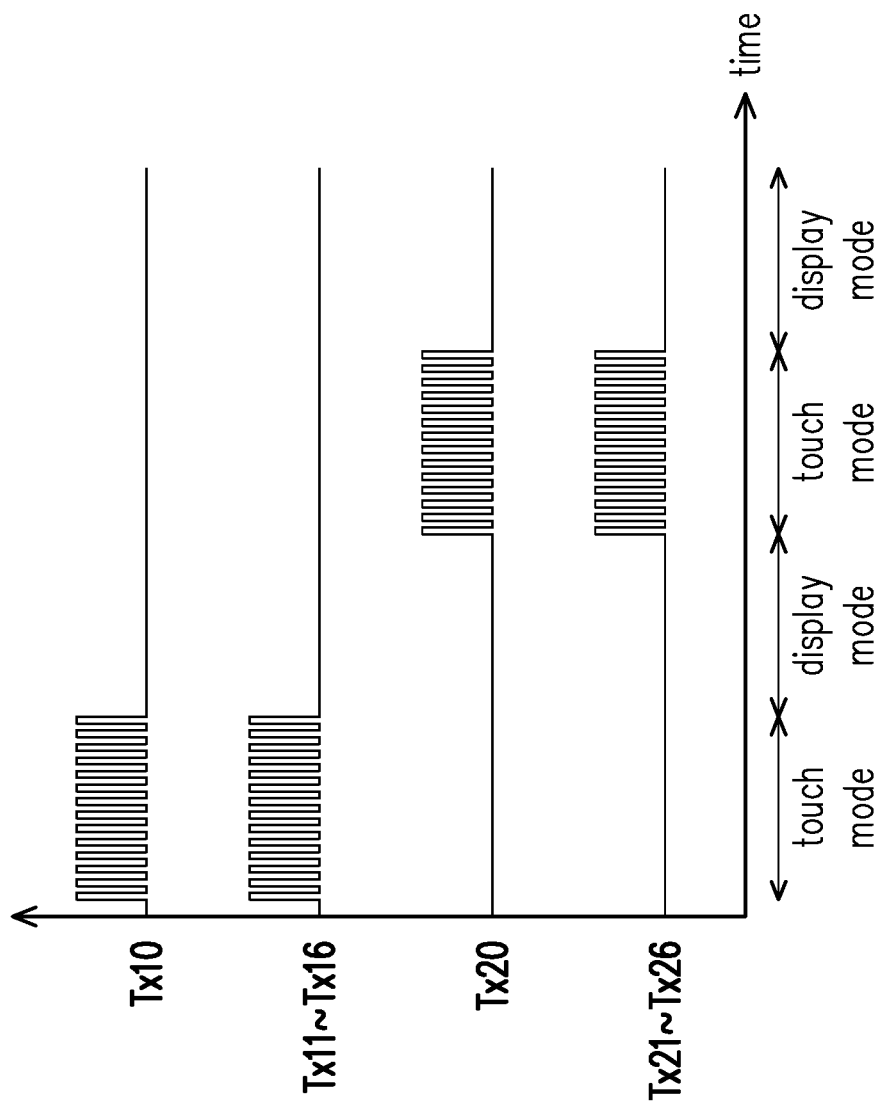
FIG. 11 is a timing waveform diagram of the array substrate of FIG. 7.

FIG. 7 is a partial top plan view of an array substrate in accordance with another embodiment of the present invention. FIG. 8 is an enlarged schematic view of a region M in FIG. 7. FIG. 9 is an enlarged schematic view of a region N in FIG. 7. FIG. 10 is a schematic cross-sectional view showing a partial region of the array substrate of FIG. 7. FIG. 11 is a timing waveform diagram of the array substrate of FIG. 7. Referring to FIG. 8, FIG. 9, FIG. 2 and FIG. 4, for convenience of description, the layers located below the first common electrode layer CM1 are omitted in FIG. 8 and FIG. 9. Further, although some layers and numerals are omitted in FIG. 8 to FIG. 10, any one of ordinary skill in the art should understand that the overall structure or layout of the array substrate 40 in accordance with the foregoing description of the embodiments of FIG. 1 to FIG. 4.

Referring to FIG. 7 to FIG. 9, in the array substrate 40, the first common electrode layer CM1 has a plurality of openings V corresponding to the drains D of the active devices T. As shown in FIG. 8 and FIG. 9, the opening V overlaps the corresponding contact window H2 on the vertical projection plane perpendicular to the normal direction n of the substrate 100. Further, in the present embodiment, the first common electrode layer CM1 is divided into a plurality of strip electrodes E1.

In the present embodiment, the plurality of signal lines Tx10 and Tx20 are disposed on the first common electrode layer CM1. Based on the conductivity considerations, the signal lines Tx10 and Tx20 are generally made of a metal material. However, the present invention is not limited thereto. According to other embodiments, the signal lines Tx10, Tx20 may be made of other conductive materials such as an alloy, a nitride of a metal material, an oxide of a metal material, an oxynitride of a metal material, or a stacked layer of said metal material and said other conductive materials described above.

In the present embodiment, the signal lines Tx10 and Tx20 are electrically connected to the strip electrodes E1, respectively. As shown in FIG. 7, any one of the signal lines Tx10, Tx20 is electrically connected to one of the strip electrodes E1 in a one-to-one relationship. Referring to FIG. 7 and FIG. 9, the signal lines Tx10 and Tx20 are electrically connected to the corresponding strip electrodes E1 through the connection structures X, respectively. The connection structure X may include a connection pattern Xa and a connection pattern Xb which are sequentially disposed on the strip electrode E1. In the present embodiment, the connection pattern Xa is electrically connected to the strip electrode E1 through the contact window H9 disposed in the insulating layer IL2, the connection pattern Xa and the pixel electrodes PE belong to the same layer, and the connection pattern Xa is structurally separated from the pixel electrodes PE. Further, in the present embodiment, the connection pattern Xb and the signal lines Tx10, Tx20 belong to a same patterned layer. For example, as shown in FIG. 9, the connection pattern Xb and the corresponding signal line Tx20 form a continuous conductive pattern. Although FIG. 7 shows that the signal line Tx10 electrically connected to the corresponding strip electrodes E1 by two connection structures X and the signal line Tx20 is electrically connected to the corresponding strip electrodes E1 by two connection structures X, the present invention does not limit the number of connection structures X, and the number of connection structures X may be adjusted according to the actual architecture and requirements of the array substrate 40. Further, in the present embodiment, the signal lines Tx10, Tx20 do not overlap the strip electrodes E1, but the present invention is not limited thereto.

In the present embodiment, the plurality of sensing lines Tx11~Tx16 and Tx21~Tx26 are disposed on the first common electrode layer CM1. In the present embodiment, the sensing lines Tx11~Tx16, Tx21~Tx26 and the signal lines Tx10, Tx20 belong to a same patterned layer. That is, in the present embodiment, the sensing lines Tx11~Tx16, Tx21~Tx26 and the signal lines Tx10, Tx20 have substantially the same material, and the sensing lines Tx11~Tx16, Tx21~Tx26 and the signal lines Tx10, Tx20 may be formed in a same mask process. Although FIG. 7 discloses that the number of the sensing line Tx11 is one, the number of the sensing line Tx12 is one, the number of the sensing line Tx13 is one, the number of the sensing line Tx14 is one, the number of the sensing line Tx15 is one, the number of the sensing line Tx16 is one, the number of the sensing line Tx21 is one, the number of the sensing line Tx22 is one, the number of the sensing line Tx23 is one, the number of the sensing line Tx24 is one, the number of the sensing line Tx25 is one, and the number of the sensing line Tx26 is one, but the present invention does not limit the numbers of the sensing lines Tx11~Tx16 and Tx21~Tx26, and the numbers of the sensing lines Tx11~Tx16 and Tx21~Tx26 may be adjusted according to the actual architecture and requirements of the array substrate 40. For example, in an embodiment, the number of the sensing line Tx11, the number of the sensing line Tx12, the number of the sensing line Tx13, the number of the sensing line Tx14, the number of the sensing line Tx15, the number of the sensing line Tx16, the number of the sensing line Tx21, the number of the sensing line Tx22, the number of the sensing line Tx23, the number of the sensing line Tx24, the number of the sensing lines Tx25 and the number of the sensing lines Tx26 may be two, respectively.

In the present embodiment, a plurality of line segment patterns SP are disposed on the first common electrode layer CM1. In the present embodiment, the line segment patterns SP, the sensing lines Tx1~Tx16, Tx21~Tx26, and the signal lines Tx10, Tx20 belong to the same layer. In other words, in the present embodiment, the line segment patterns SP, the sensing lines Tx11~Tx16, Tx21~Tx26 and the signal lines Tx10, Tx20 have substantially the same material, and the line segment patterns SP, the sensing lines Tx11~Tx16, Tx21~Tx26 and the signal lines Tx10, Tx20 may be formed in a same mask process.

In the present embodiment, the second common electrode layer CM2 is divided into a plurality of sensing electrodes E2, and each sensing electrode E2 overlaps the corresponding strip electrode E1 on the vertical projection plane perpendicular to the normal direction n of the substrate 100. Although FIG. 7 discloses that each strip electrode E1 overlaps six sensing electrodes E2 on the vertical projection plane perpendicular to the normal direction n of the substrate 100, the present invention is not limited thereto. In other embodiments, the number of sensing electrodes E2 overlapped with one strip electrode E1 may be adjusted according to the actual architecture and requirements of the array substrate 40.

In the present embodiment, the sensing electrodes E2 are electrically connected to the sensing lines Tx11~Tx16 and Tx21~Tx26, respectively. In detail, each of the sensing electrodes E2 is electrically connected to the corresponding one of the sensing lines Tx11~Tx16 and Tx21~Tx26 by a plurality of contact windows H10, wherein the contact windows H10 are disposed in the insulating layer IL3. Although FIG. 7 discloses that each sensing electrode E2 is electrically connected to the corresponding one of the sensing lines Tx11~Tx16 and Tx21~Tx26 by four contact windows H10, the present invention does not limit the number and the arrangement of the contact windows H10, and the number of contact windows H10 may be adjusted according to the actual architecture and requirements of the array substrate 40. In addition, as shown in FIG. 7, any one of the sensing electrodes E2 is electrically connected to one of the sensing lines Tx11~Tx16, Tx21~Tx26 in a one-to-one relationship, but the present invention is not limited thereto.

In the present embodiment, a part of the sensing electrodes E2 overlaps with the corresponding line segment patterns SP on the vertical projection plane perpendicular to the normal direction n of the substrate 100. As shown in FIG. 7, on the vertical projection plane perpendicular to the normal direction n of the substrate 100, the sensing electrode E2 electrically connected to the sensing line Tx11 overlaps five line segment patterns SP, and the sensing electrode E2 electrically connected to the sensing line Tx12 overlaps four line segment patterns SP, and the rest of the configuration relationship can be referred to the foregoing analogy, and details are not described herein. In addition, in this embodiment, each line segment pattern SP is electrically connected to the corresponding sensing electrode E2 by a plurality of contact windows H11 to reduce the resistance value of the sensing electrode E2, wherein the contact windows H11 are disposed in the insulating layer IL3. Although FIG. 7 discloses that each line segment pattern SP is electrically connected to the corresponding sensing electrode E2 through four contact windows H11, the present invention does not limit the number of contact windows H11, and the number and the arrangement of the contact windows H11 may be adjusted according to the actual architecture and requirements of the array substrate 40.

In the present embodiment, the second common electrode layer CM2 divided into the sensing electrodes E2 may not only be used as a display electrode due to the fringe electric field generated between the edge of the second slit J2 and the corresponding pixel electrode PE, but also be used as the touch electrode, and when the second common electrode layer CM2 may be used as the touch electrode, the touch information is transmitted via the sensing lines Tx11~Tx16 and Tx21~Tx26. That is, in the present embodiment, the array substrate 40 can be applied to a touch display panel.

Referring to FIG. 10, in the present embodiment, the first common electrode layer CM1 and the first conductive layer CL1 are structurally separated, and the second common electrode layer CM2 and the third conductive layer CL3 are structurally separated. In the present embodiment, the conductive structure 104 including the first conductive layer CL1, the second conductive layer CL2, and the third conductive layer CL3 may be electrically connected to a common voltage, which is, for example, about 0 volt. In addition, in the present embodiment, the first common electrode layer CM1 and the first conductive layer CL1 may be controlled by the external circuit to receive signals at substantially the same level, and the second common electrode layer CM2 and the third conductive layer CL3 may be controlled by the external circuit to receive signals at substantially the same level. For example, when the array substrate 40 is applied to the touch display panel, the conductive structure 104, the first common electrode layer CM1 and the second common electrode layer CM2 are electrically connected to substantially the same common voltage in the display mode. The said common voltage is, for example, about 0 volt.

Referring to FIG. 11, when the array substrate 40 is applied to the touch display panel, the display mode and the touch mode are time-divisionally driven. FIG. 11 illustrates a waveform diagram of the sensing lines Tx11~Tx16 and the sensing lines Tx21~Tx26 in the touch mode. The touch mode and the display mode are, for example, arranged alternately. In other words, the touch mode is interspersed between the two display modes sequentially executed. In addition, for convenience of description, the timing waveforms of the respective signal lines (for example, the scan lines SL, the data lines DL, and the like) in the display mode are omitted in FIG. 11. In addition, the part of the sensing electrodes E2 electrically connected to the sensing lines Tx11~Tx16 and the strip electrodes E1 corresponding to the said part of the sensing electrodes E2 are simultaneously driven in a touch mode, and the another part of the sensing electrodes E2 electrically connected to the sensing lines Tx21~Tx26 and the strip electrodes E1 corresponding to the said another part of the sensing electrodes E2 are simultaneously driven in another touch mode, but the invention is not limited thereto.

In the present embodiment, in the display mode, a storage capacitor Cst1 is formed between the first common electrode layer CM1 and the pixel electrodes PE, and a storage capacitor Cst2 electrically connected in parallel with the storage capacitor Cst1 is formed between the second common electrode layer CM2 and the pixel electrodes PE, so the storage capacitance value of the pixel structures U of the array substrate 40 may increase. Further, in the present embodiment, in the touch mode, the array substrate 40 includes the first common electrode layer CM1, so that the touch signals received by the second common electrode layer CM2 (ie, the sensing electrodes E2) are not easy to be interfered by the signals of the active devices T, the scan lines SL, and the data lines DL. Therefore, when the array substrate 40 is applied to the high-resolution touch display panel, not only influence of the feedthrough effect on the pixel structures U may be reduced, but also the signal-to-noise ratio and the sensing capability of the touch display panel may be improved.

Further, in the array substrate 40, the first common electrode layer CM1 is divided into the strip electrodes E1, but the present invention is not limited thereto. Hereinafter, other embodiments will be described with reference to FIG. 12 to FIG. 14. It should be noted that the reference numerals and some descriptions in the previous embodiment are used in the following embodiments, in which identical or similar reference numerals indicate identical or similar elements, and repeated description of the same technical contents is omitted. The omitted part of the description can refer to the foregoing embodiments, which is not repeated in the following embodiments.

Figure 12:
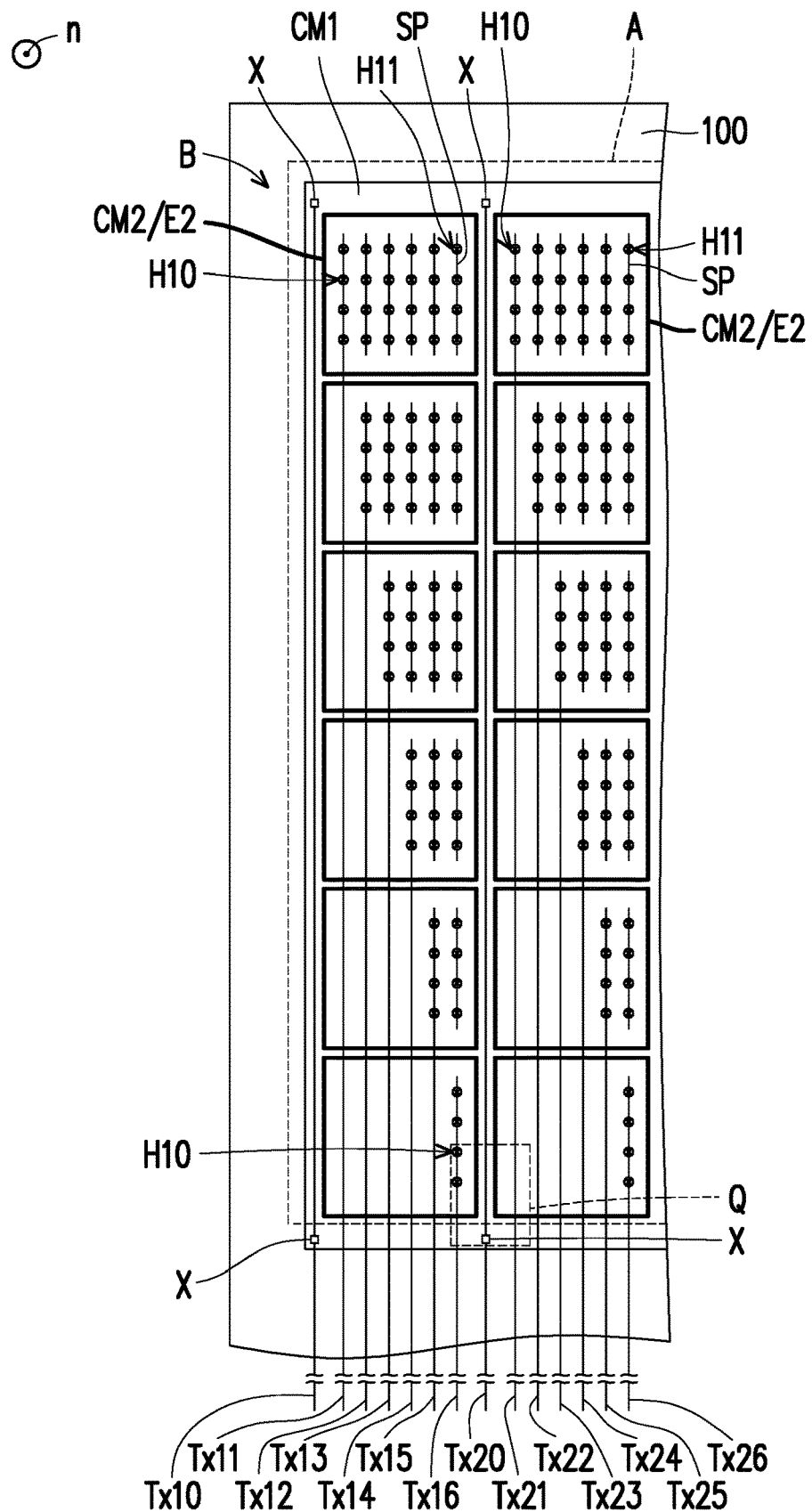
FIG. 12 is a partial top plan view of an array substrate in accordance with another embodiment of the present invention.
Figure 13:
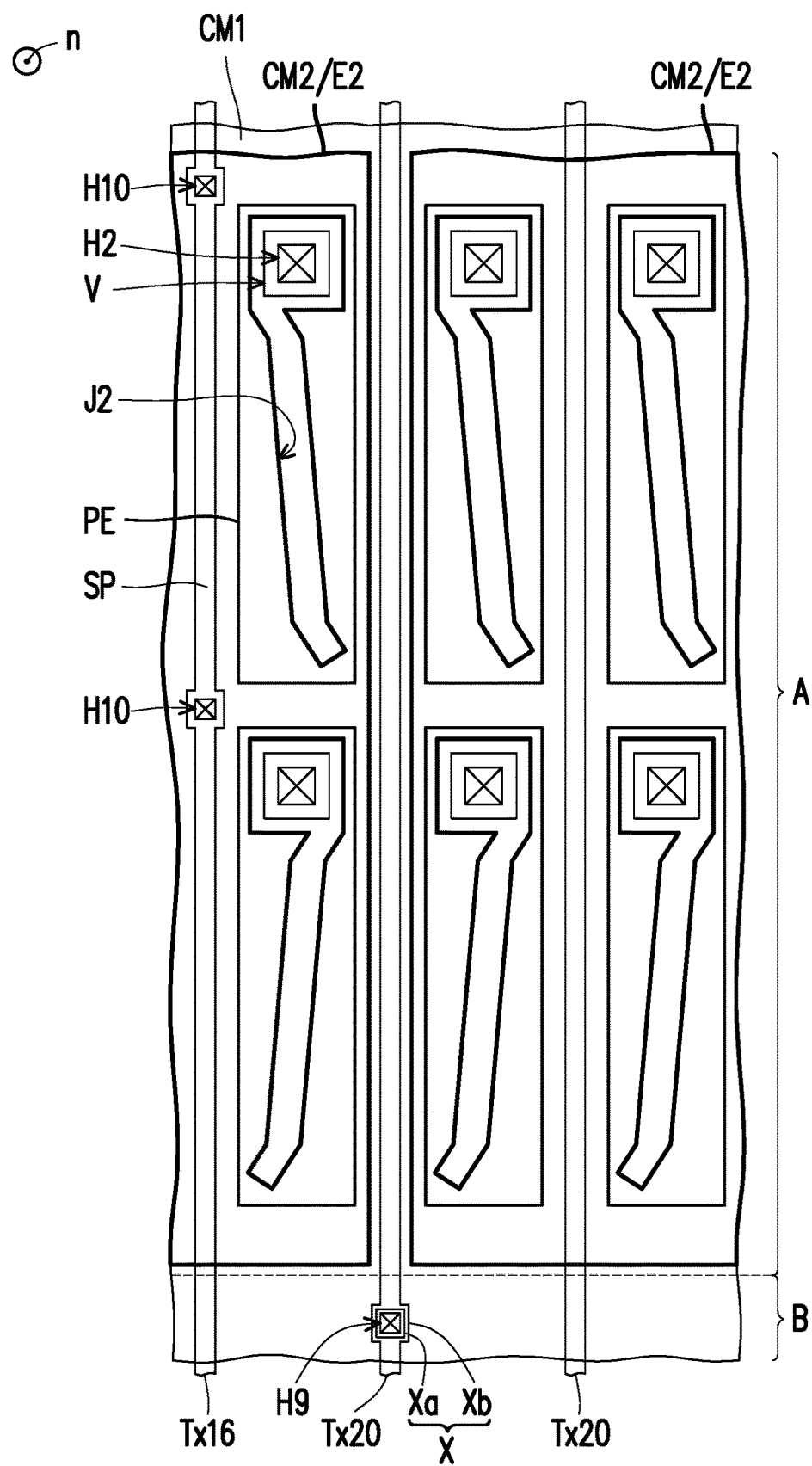
FIG. 13 is an enlarged schematic view of a region Q in FIG. 12.
Figure 14:
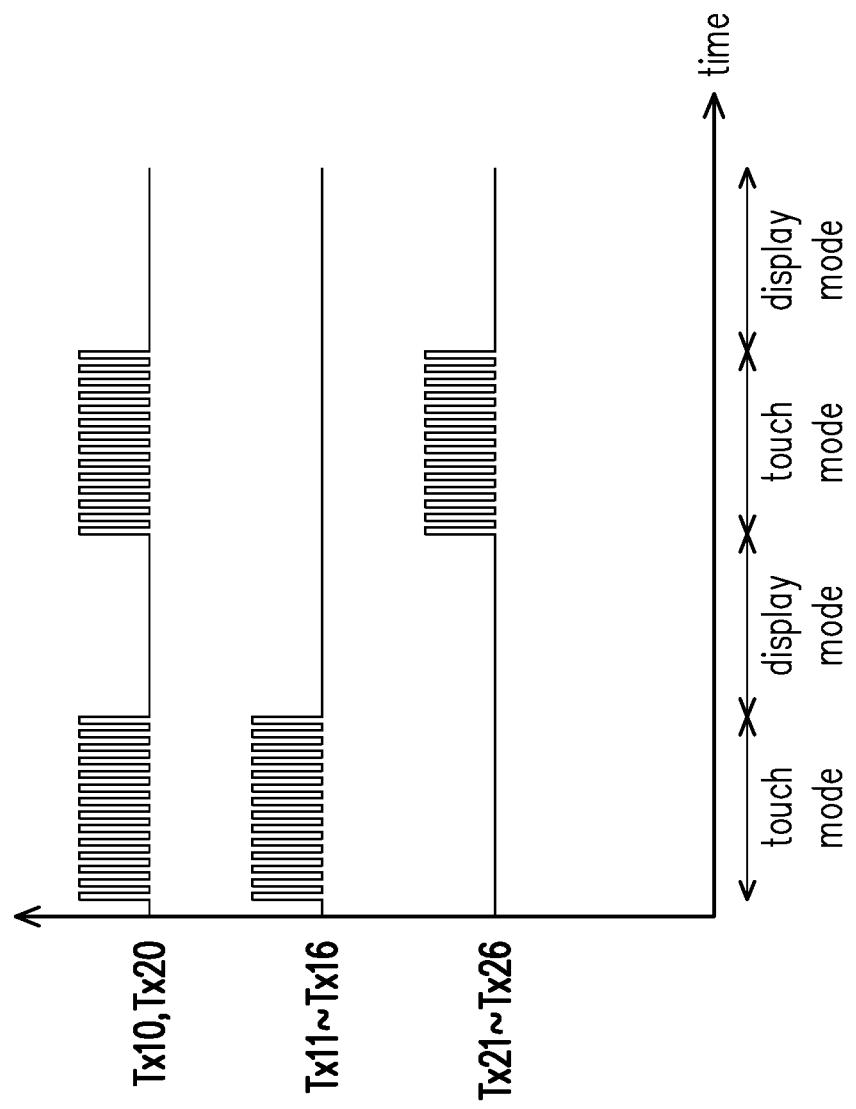
FIG. 14 is a timing waveform diagram of the array substrate of FIG. 12.

FIG. 12 is a partial top plan view of an array substrate in accordance with another embodiment of the present invention. FIG. 13 is an enlarged schematic view of a region Q in FIG. 12. FIG. 14 is a timing waveform diagram of the array substrate of FIG. 12. Referring to FIG. 12 and FIG. 7, the array substrate 50 of FIG. 12 is similar to the array substrate 40 of FIG. 7, and therefore identical or similar elements are denoted by identical or similar reference numerals, and the description of the same technical contents is omitted. The omitted part of the description can refer to the foregoing embodiments. For convenience of explanation, the layers located below the first common electrode layer CM1 are omitted in FIG. 13. Further, although some layers are omitted in FIG. 13, in accordance with the foregoing description of the embodiments of FIG. 1 to FIG. 4, it should be understood by those of ordinary skill in the art that the overall structure or layout of the array substrate 50 of FIG. 12. Hereinafter, the difference between the array substrate 50 of FIG. 12 and the array substrate 40 of FIG. 7 will be described.

Referring to FIG. 12 and FIG. 13, in the array substrate 50, the first common electrode layer CM1 is not divided into a plurality of strip patterns corresponding to the sensing electrodes E2. In other words, in the present embodiment, the signal line Tx10 and the signal line Tx20 are electrically connected to the first common electrode layer CM1. In this way, when the array substrate 50 is applied to the touch display panel, the first common electrode layer CM1 is driven in the touch modes of different time periods, as shown in FIG. 14. Further, in the array substrate 50, the signal lines Tx10, Tx20 overlap the first common electrode layer CM1 on the vertical projection plane perpendicular to the normal direction n of the substrate 100. For the rest, please refer to the foregoing embodiments, and details are not described herein.

Further, in the array substrate 40 and the array substrate 50, the first common electrode layer CM1 and the second common electrode layer CM2 do not have same contours on the vertical projection plane perpendicular to the normal direction n of the substrate 100, that is, the first common electrode layer CM1 and the second common electrode layer CM2 are not fabricated by using a same mask, but the present invention is not limited thereto. Hereinafter, other embodiments will be described with reference to FIG. 15 and FIG. 16. It should be noted that the reference numerals and some descriptions in the previous embodiment are used in the following embodiments, in which identical or similar reference numerals indicate identical or similar elements, and repeated description of the same technical contents is omitted. The omitted part of the description can refer to the foregoing embodiments, which is not repeated in the following embodiments.

Figure 15:
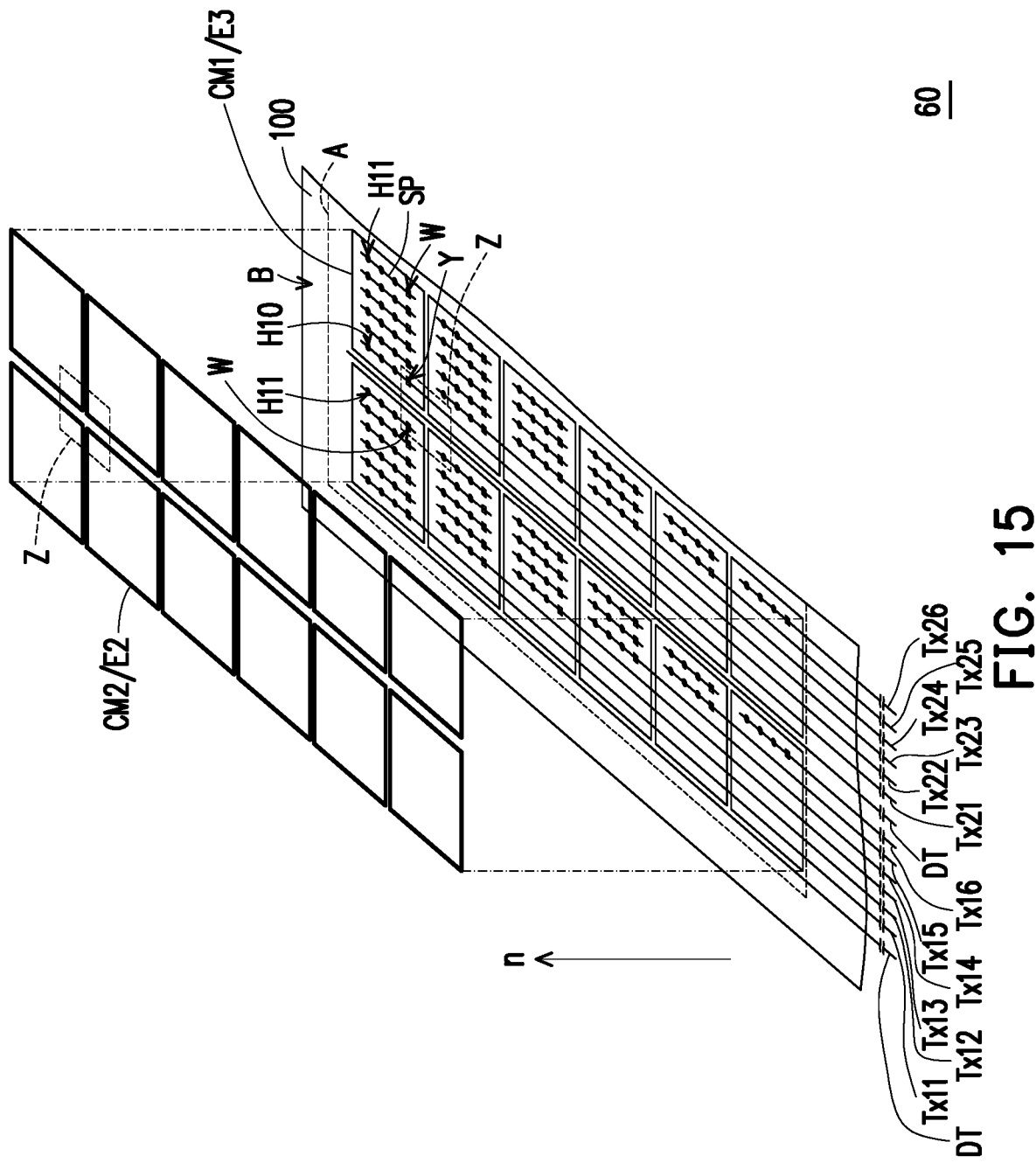
FIG. 15 is a partial exploded view of an array substrate in accordance with another embodiment of the present invention.
Figure 16:
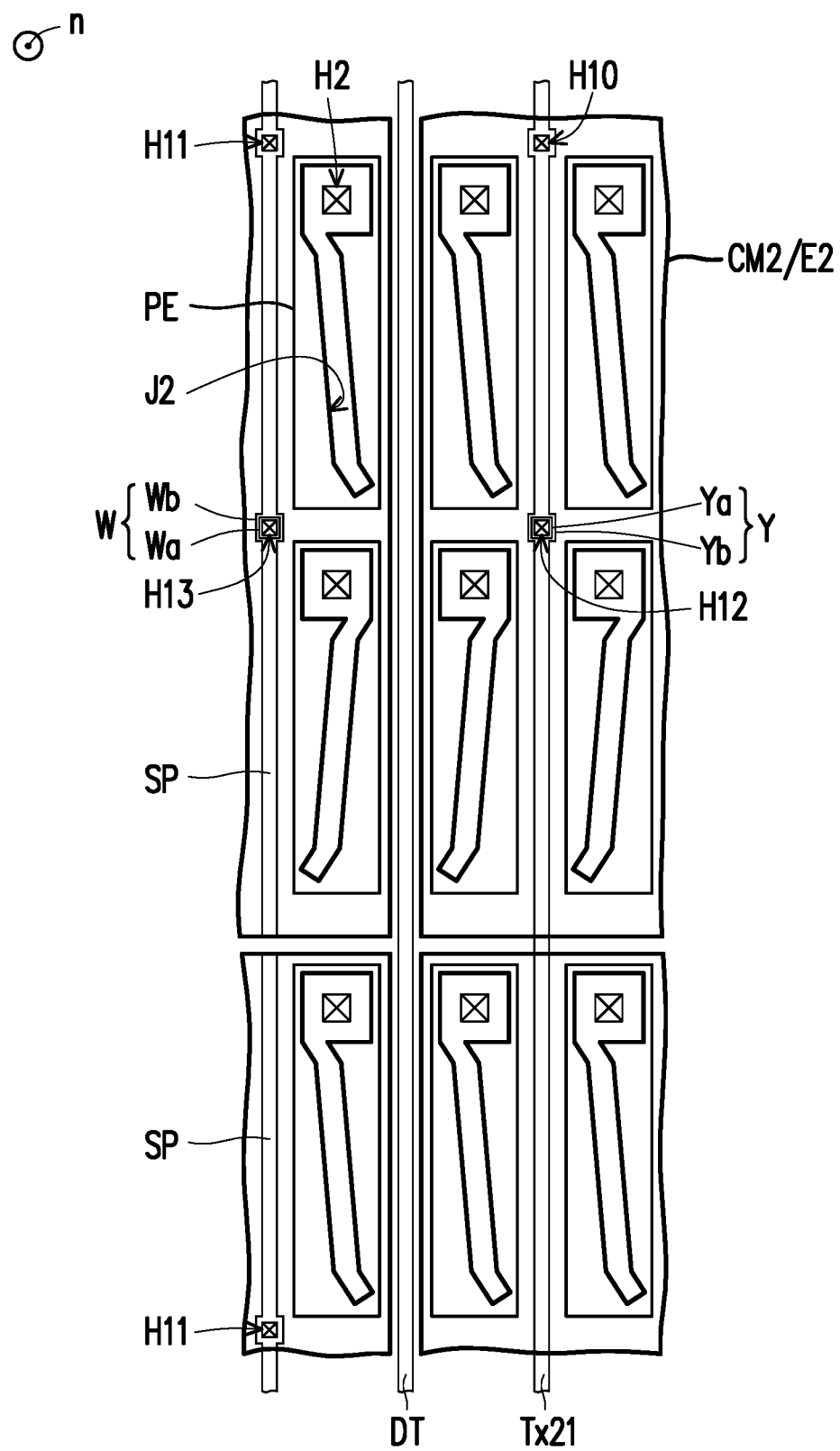
FIG. 16 is an enlarged schematic view of a region Z in FIG. 15.

FIG. 15 is a partial exploded view of an array substrate in accordance with another embodiment of the present invention. FIG. 16 is an enlarged schematic view of a region Z in FIG. 15. Referring to FIG. 15 and FIG. 7, the array substrate 60 of FIG. 15 is similar to the array substrate 40 of FIG. 7, and the difference mainly lies in: in the array substrate 60, the first common electrode layer CM1 and the second common electrode layer CM2 have same contours on the vertical projection plane perpendicular to the normal direction n of the substrate 100, and however in the array substrate 40, the first common electrode layer CM1 and the second common electrode layer CM2 do not have same contours on the vertical projection plane perpendicular to the normal direction n of the substrate 100. It is to be noted that, for convenience of explanation and observation, the first common electrode layer CM1 is omitted in FIG. 16. Further, although some layers are omitted in FIG. 16, in accordance with the foregoing description of the embodiments of FIG. 1 to FIG. 4, it should be understood by those of ordinary skill in the art that the overall structure or layout of the array substrate 60 of FIG. 15. The differences between the array substrate 60 of FIG. 15 and the array substrate 40 of FIG. 7 will be described below, and identical or similar elements are denoted by identical or reference numerals, and the description of the same technical contents is omitted. The omitted part of the description can refer to the foregoing embodiments.

Referring to FIG. 15, in the array substrate 60, the first common electrode layer CM1 is divided into a plurality of block electrodes E3. Since the first common electrode layer CM1 and the second common electrode layer CM2 have same contours on the vertical projection plane perpendicular to the normal direction n of the substrate 100 in the array substrate 60, the block electrodes E3 overlap the sensing electrodes E2 on the vertical projection plane perpendicular to the normal direction n of the substrate 100.

In addition, although the first common electrode layer CM1 that is shielded by the second common electrode layer CM2 is omitted in FIG. 16, according to the foregoing description of the embodiments of FIG. 1 to FIG. 4, any one of ordinary skill in the art should understand that, in the array substrate 60, the first common electrode layer CM1 has the first slits J1 respectively overlapping the second slits J2 of the second common electrode layer CM2 on the vertical projection plane perpendicular to the normal direction n of the substrate 100.

In the present embodiment, the block electrodes E3 are electrically connected to the sensing lines Tx11~Tx16 and Tx21~Tx26, respectively. In detail, each of the block electrodes E3 is electrically connected to a corresponding one of the sensing lines Tx11~Tx16 and Tx21~Tx26 by a connection structure Y. The connection structure Y may include a connection pattern Ya and a connection pattern Yb which are sequentially disposed on the block electrode E3. In the present embodiment, the connection pattern Ya is electrically connected to the block electrode E3 by the contact window H12 disposed in the insulating layer IL2, the connection pattern Ya and the pixel electrodes PE belong to a same patterned layer, and the connection pattern Ya and the pixel electrodes PE are structurally separated. Further, in the present embodiment, the connection pattern Yb and the sensing lines Tx11~Tx16, Tx21~Tx26 belong to a same patterned layer. For example, as shown in FIG. 16, the connection pattern Yb and the corresponding sensing line Tx21 form a continuous conductive pattern.

Although FIG. 15 discloses that each of the sensing lines Tx11~Tx16 and Tx21~Tx26 is electrically connected to the corresponding block electrode E3 by one connection structure Y, the present invention does not limit the number of the connection structure Y, and the number of the connection structure Y may be adjusted according to the actual architecture and requirements of the array substrate 60. Further, as shown in FIG. 15, any one of the block electrodes E3 is electrically connected to one of the sensing lines Tx11~Tx16 and Tx21~Tx26 in a one-to-one relationship, but the present invention is not limited thereto. In addition, in the present embodiment, each of the sensing electrodes E2 is electrically connected to the corresponding one of the sensing lines Tx11~Tx16 and Tx21~Tx26 through the contact windows H10, so any one of the sensing lines Tx11~Tx16 and Tx21~Tx26 is electrically connected to both of the corresponding sensing electrode E2 and the corresponding block electrode E3. In other words, in the present embodiment, the first common electrode layer CM1 and the second common electrode layer CM2 may receive signals at substantially the same level.

In the present embodiment, at least some of the block electrodes E3 overlap the corresponding line segment patterns SP on the vertical projection plane perpendicular to the normal direction n of the substrate 100. As shown in FIG. 15, on the vertical projection plane perpendicular to the normal direction n of the substrate 100, the block electrode E3 which is electrically connected to the sensing line Tx11 overlaps five line segment patterns SP, and the block electrode E3 which is electrically connected to the sensing line Tx12 overlaps four line segment patterns SP, and the rest of the arrangement relationship can be referred to the analogy of the foregoing description, and details are not described herein. In addition, in the present embodiment, each line segment pattern SP is electrically connected to the corresponding block electrode E3 by a connection structure W to reduce the resistance value of the block electrode E3. The connection structure W may include a connection pattern Wa and a connection pattern Wb which are sequentially disposed on the block electrode E3. In the present embodiment, the connection pattern Wa is electrically connected to the block electrode E3 by the contact window H13 disposed in the insulating layer IL2, the connection pattern Wa and the pixel electrodes PE belong to a same patterned layer, and the connection pattern Wa and the pixel electrodes PE are structurally separated. Further, in the present embodiment, the connection pattern Wb and the line segment patterns SP belong to a same patterned layer. For example, as shown in FIG. 16, the connection pattern Wb and the corresponding line segment pattern SP form a continuous conductive pattern. Although FIG. 15 discloses that each line segment pattern SP is electrically connected to the corresponding block electrode E3 by one connection structure W, the present invention does not limit the number of connection structure W, and the number of connection structure W may be adjusted according to the actual architecture and requirements of the array substrate 60.

Further, in the present embodiment, a plurality of dummy signal lines DT are disposed on the first common electrode layer CM1. In the present embodiment, the dummy signal lines DT, the sensing lines Tx11~Tx16, Tx21~Tx26, the signal lines Tx10, Tx20, and the line segment patterns SP belong to a same patterned layer. In other words, in the present embodiment, the dummy signal lines DT, the sensing lines Tx11~Tx16, Tx21~Tx26, the signal lines Tx10, Tx20 and the line segment patterns SP have substantially the same material, and the dummy signal lines DT, the sensing lines Tx11~Tx16, Tx21~Tx26, the signal lines Tx10, Tx20 and the line segment patterns SP may be formed in a same mask process. In addition, in the present embodiment, the dummy signal lines DT may be electrically connected to a common voltage, which is, for example, about 0 volt, so that the pixel structures U of the array substrate 60 have a uniform capacitance value. For the rest, please refer to the foregoing embodiments, and details are not described herein.

In summary, in the array substrate of at least one embodiment of the present invention, the pixel structures are located in the display area of the substrate, each pixel structure includes the active device and the pixel electrode, the color filter patterns are respectively disposed corresponding to the pixel structures, the first common electrode layer is disposed on the color filter patterns and structurally separated from the pixel electrodes, the second common electrode layer is disposed on the first common electrode layer and structurally separated from the pixel electrodes, the conductive structure is located in the peripheral area of the substrate and includes the first conductive layer belonging to a same patterned layer as the first common electrode layer, the second conductive layer that belonging to a same patterned layer as the pixel electrodes, and the third conductive layer belonging to a same patterned layer as the second common electrode layer, and the first conductive layer, the second conductive layer and the third conductive layer are sequentially disposed on the substrate, whereby the storage capacitor value of the pixel structures may be effectively increased when the array substrate is driven. In this way, when the array substrate is applied to a high-resolution display panel, the pixel structure may be reduced from the influence of the feedthrough effect.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An array substrate, comprising:
a substrate having a display area and a peripheral area, the peripheral area being located on at least one side of the display area;
a plurality of pixel structures located in the display area of the substrate, wherein each of the pixel structures comprises an active device and a pixel electrode;
a plurality of color filter patterns located in the display area of the substrate and disposed corresponding to the pixel structures;
a first common electrode layer disposed on the color filter patterns and structurally separated from the pixel electrodes;
a second common electrode layer disposed on the first common electrode layer and structurally separated from the pixel electrodes;
an conductive structure located in the peripheral area of the substrate, wherein the conductive structure comprises a first conductive layer, a second conductive layer and a third conductive layer sequentially disposed on the substrate, the first conductive layer and the first common electrode layer belong to a first patterned layer, the second conductive layer and the pixel electrodes belong to a second patterned layer, and the third conductive layer and the second common electrode layer belong to a third patterned layer; and a conductive pattern located in the peripheral area of the substrate, wherein the conductive structure is electrically connected to the conductive pattern.

2. The array substrate of claim 1, wherein the first common electrode layer is in contact with the color filter patterns.

3. The array substrate of claim 1, wherein the first common electrode layer and the second common electrode layer have same contours on a vertical projection plane perpendicular to a normal direction of the substrate.

4. The array substrate according to claim 1, wherein the first common electrode layer has a plurality of first slits corresponding to the pixel electrodes, and the second common electrode layer has a plurality of second slits corresponding to the pixel electrodes, wherein the first slits respectively overlap the second slits on a vertical projection plane perpendicular to a normal direction of the substrate.

5. The array substrate of claim 1, wherein the first common electrode layer is directly connected to the first conductive layer, the second common electrode layer is directly connected to the third conductive layer, and the pixel electrodes are structurally separated from the second conductive layer.

6. The array substrate of claim 1, further comprising:
a plurality of pad structures located in the peripheral area of the substrate, wherein each of the pad structures includes a fourth conductive layer, a fifth conductive layer, and a sixth conductive layer sequentially disposed on the substrate, the fourth conductive layer and the first common electrode layer belong to a first patterned layer, the fifth conductive layer and the pixel electrodes belong to a second patterned layer, and the sixth conductive layer and the second common electrode layer belong to a third patterned layer.

7. The array substrate according to claim 1, further comprising:
a plurality of sensing lines disposed on the first common electrode layer, wherein
the second common electrode layer is divided into a plurality of sensing electrodes, and the sensing lines are electrically connected to the sensing electrodes respectively.

8. The array substrate of claim 7, further comprising:
a plurality of signal lines disposed on the first common electrode layer, wherein
the signal lines and the sensing lines belong to the same layer, and the first common electrode layer is divided into a plurality of strip electrodes, and the signal lines are electrically connected to the strip electrodes respectively.

9. The array substrate according to claim 7, wherein the first common electrode layer is divided into a plurality of block electrodes, and the block electrodes are overlapped with the sensing electrodes on a vertical projection plane perpendicular to a normal direction of the substrate, and each of the sensing lines is electrically connected to the corresponding sensing electrode and the corresponding block electrode, wherein the first common electrode layer and the second common electrode layer have same contours on the vertical projection plane perpendicular to the normal direction of the substrate, wherein the first common electrode layer has a plurality of first slits corresponding to the pixel electrodes, the second common electrode layer has a plurality of second slits corresponding to the pixel electrodes, wherein the first slits respectively overlap the second slits on the vertical projection plane perpendicular to the normal direction of the substrate.

10. The array substrate of claim 7, wherein the first common electrode layer is structurally separated from the first conductive layer, the second common electrode layer is structurally separated from the third conductive layer, and the pixel electrodes are structurally separated from the second conductive layer.

* * * * *